US006837978B1

(12) United States Patent
Hey et al.

(10) Patent No.: US 6,837,978 B1
(45) Date of Patent: Jan. 4, 2005

(54) DEPOSITION UNIFORMITY CONTROL FOR ELECTROPLATING APPARATUS, AND ASSOCIATED METHOD

(75) Inventors: H. Peter W. Hey, Sunnyvale, CA (US); Yezdi N. Dordi, Palo Alto, CA (US); Donald J. K. Olgado, Palo Alto, CA (US); Mark Denome, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 59 days.

(21) Appl. No.: 09/687,053

(22) Filed: Oct. 12, 2000

Related U.S. Application Data

(63) Continuation-in-part of application No. 09/289,074, filed on Apr. 8, 1999, now Pat. No. 6,258,220.
(60) Provisional application No. 60/216,790, filed on Jul. 7, 2000.

(51) Int. Cl.[7] .......................... C25D 21/12; C25D 5/00; C25D 17/00
(52) U.S. Cl. ....................... 205/84; 205/96; 204/224 R; 204/229.8; 204/275.1; 204/227
(58) Field of Search .................. 204/225, 224 R, 204/229.8, 275.1, 227; 205/96, 83, 84

(56) References Cited

U.S. PATENT DOCUMENTS

| | | | |
|---|---|---|---|
| 3,649,509 A | 3/1972 | Morawetz et al. .......... 204/238 |
| 3,727,620 A | 4/1973 | Orr ............................. 134/95 |
| 3,770,598 A | 11/1973 | Creutz ...................... 204/52 R |
| 4,027,686 A | 6/1977 | Shortes et al. ................ 134/33 |
| 4,092,176 A | 5/1978 | Kozai et al. ................ 134/186 |
| 4,110,176 A | 8/1978 | Creutz al. ................. 204/52 R |
| 4,113,492 A | 9/1978 | Sato et al. ..................... 96/67 |
| 4,177,113 A | * 12/1979 | Seibt ............................. 205/76 |
| 4,304,641 A | * 12/1981 | Grandia et al. ...... 204/229.8 X |
| 4,315,059 A | 2/1982 | Raistrick et al. ............. 429/112 |
| 4,326,940 A | 4/1982 | Eckles et al. ................ 204/232 |
| 4,336,114 A | 6/1982 | Mayer et al. ............. 204/52 R |
| 4,376,685 A | 3/1983 | Watson ...................... 204/52 R |
| 4,405,416 A | 9/1983 | Raistrick et al. .............. 204/68 |
| 4,428,815 A | 1/1984 | Powell et al. ................ 204/297 |

(List continued on next page.)

FOREIGN PATENT DOCUMENTS

| | | | |
|---|---|---|---|
| JP | 58182823 | 10/1983 | ......... H01L/21/288 |
| JP | 63118093 | 5/1988 | ............ C25D/5/18 |
| JP | 04131395 | 5/1992 | ............ C25D/5/34 |
| JP | 04280993 | 10/1992 | ............ C25D/5/18 |
| JP | 6017291 | 1/1994 | ............ C25D/7/12 |

(List continued on next page.)

OTHER PUBLICATIONS

PCT International Search Report for PCT/US01/20625, dated Jun. 15, 2004 (AMAT/2601.PC.06).

(List continued on next page.)

*Primary Examiner*—Donald R. Valentine
(74) *Attorney, Agent, or Firm*—Moser, Patterson & Sheridan

(57) ABSTRACT

A method and associated apparatus for electro-chemically depositing a metal film on a substrate having a metal seed layer. The apparatus comprises a substrate holder that holds the substrate. The electrolyte cell receives the substrate in a processing position. The actuator is connected to the substrate holder and adjustably positions the substrate relative to the electrolyte cell. The method involves electro-chemically depositing a metal film on a substrate having a metal seed layer comprising disposing the substrate in an electrolyte cell that is configured to receive the substrate. The method comprises adjustably positioning the substrate relative to the electrolyte cell.

30 Claims, 25 Drawing Sheets

U.S. PATENT DOCUMENTS

| | | | |
|---|---|---|---|
| 4,435,266 A | 3/1984 | Johnston | 204/276 |
| 4,466,864 A | 8/1984 | Bacon et al. | |
| 4,489,740 A | 12/1984 | Rattan et al. | 134/140 |
| 4,510,176 A | 4/1985 | Cuthbert et al. | 427/82 |
| 4,518,678 A | 5/1985 | Allen | 430/311 |
| 4,519,846 A | 5/1985 | Aigo | 134/15 |
| 4,693,805 A | 9/1987 | Quazi | 204/192.22 |
| 4,732,785 A | 3/1988 | Brewer | 427/240 |
| 4,789,445 A | 12/1988 | Goffman et al. | 204/114 |
| 4,879,007 A * | 11/1989 | Wong | 204/225 X |
| 5,039,381 A | 8/1991 | Mullarkey | 204/47.5 |
| 5,055,425 A | 10/1991 | Leibovitz et al. | 437/195 |
| 5,092,975 A | 3/1992 | Yamamura et al. | 204/198 |
| 5,155,336 A | 10/1992 | Gronet et al. | 219/411 |
| 5,162,260 A | 11/1992 | Leibovitz et al. | 437/195 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,349,978 A | 9/1994 | Sago et al. | 134/153 |
| 5,368,711 A | 11/1994 | Poris | 204/193 |
| 5,377,708 A | 1/1995 | Bergman et al. | 134/105 |
| 5,415,890 A | 5/1995 | Kloiber et al. | 427/242 |
| 5,429,733 A | 7/1995 | Ishida | 204/224 R |
| 5,447,615 A | 9/1995 | Ishida | 204/224 R |
| 5,458,756 A * | 10/1995 | Bassous et al. | 204/224 R |
| 5,516,412 A | 5/1996 | Andricacos et al. | 204/224 R |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 6,015,462 A | 1/2000 | Doolittle | 118/668 |
| 6,071,388 A | 6/2000 | Uzoh | 204/297 R |
| 6,093,291 A | 7/2000 | Izumi et al. | 204/224 R |
| 6,099,702 A | 8/2000 | Reid et al. | 204/212 |
| 6,113,759 A | 9/2000 | Uzoh | |
| 6,214,193 B1 | 4/2001 | Reid et al. | 205/122 |
| 6,217,727 B1 * | 4/2001 | Moore | 204/225 |
| 6,228,231 B1 | 5/2001 | Uzoh | 204/224 R |
| 6,228,232 B1 | 5/2001 | Woodruff et al. | 204/242 |
| 6,251,251 B1 | 6/2001 | Uzoh et al. | |
| 6,280,582 B1 | 8/2001 | Woodruff et al. | 204/242 |
| 6,351,682 B1 | 2/2002 | Doolittle | 700/121 |
| 6,391,166 B1 | 5/2002 | Wang | 204/224 R |
| 6,395,101 B1 | 5/2002 | Scranton et al. | 134/32 |
| 6,409,829 B1 | 6/2002 | Bastek et al. | 117/95 |
| 6,436,249 B1 | 8/2002 | Patton et al. | 204/212 |

FOREIGN PATENT DOCUMENTS

| | | | |
|---|---|---|---|
| WO | WO 97/12079 | 4/1997 | C25D/5/02 |
| WO | WO 99/25902 | 5/1999 | C25B/13/00 |
| WO | WO 99/25903 | 5/1999 | C25D/5/00 |
| WO | WO 99/25904 | 5/1999 | C25D/5/02 |
| WO | WO 99/25905 | 5/1999 | C25D/5/02 |
| WO | WO 99/26275 | 5/1999 | |
| WO | WO 00/03067 A1 | 1/2000 | |
| WO | WO 00/32835 A2 | 6/2000 | |

OTHER PUBLICATIONS

PCT International Search Report dated Feb. 7, 2000.

Kenneth E. Pitney, "NEY Contact Manual," Electrical Contacts for Low Energy Uses, 1973, no month.

Vertezq Online©, "Products Overview," 1996–1998, 5 pages, no month.

Lucio Colombo, "Wafer Back Surface Film Removal," Central R&D, SGS–Thompson, Microelectronics, Agrate, Italy, 6 pages, no date.

Semitool©, Inc., "Metallization & Interconnect," 1998, 4 pages, no month.

Laurell Technologies Corporation, "Two control configuration available–see *WS 400 or WS–400Lite*," Oct. 19, 1998, 6 pages.

Peter Singer, "Tantalum, Copper and Damascene: The Future of Interconnects," Semiconductor International, Jun., 1998, pp. cover, 91–92,94,96 & 98.

Peter Singer, "Wafer Processing," Semiconductor International, Jun., 1998, p. 70.

Australian Patent Office Written Opinion from SG 9906158–2, Dated Mar. 5, 2002.

Graham, Kenneth A., *Electroplating Engineering Handbook*, $2^{nd}$ Edition. (Copy not available to Applicant at this time), no date.

\* cited by examiner

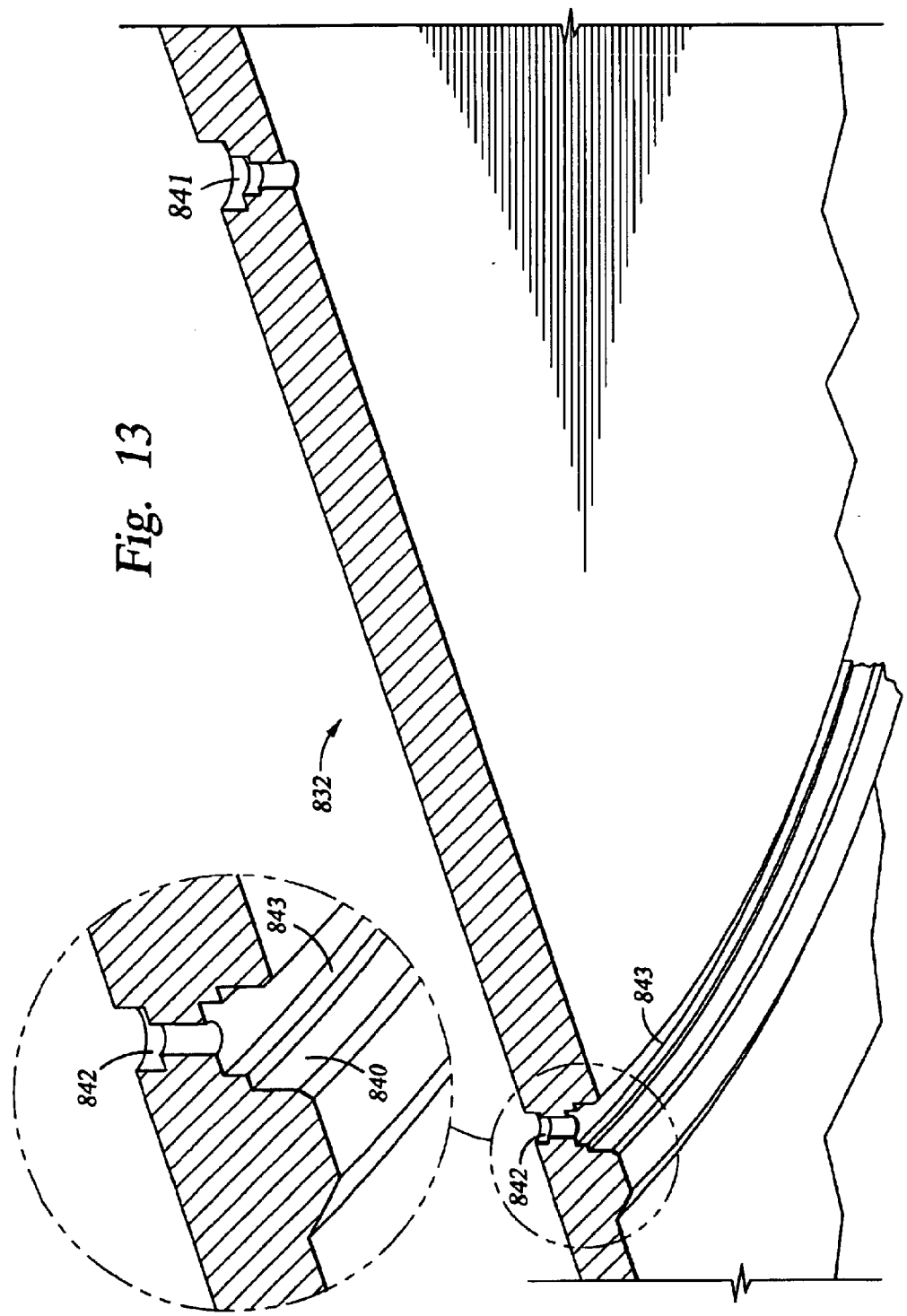

DEPOSITION UNIFORMITY CONTROL FOR ELECTROPLATING APPARATUS, AND ASSOCIATED METHOD

CONTINUATION INFORMATION

This disclosure is claiming priority to commonly assigned U.S. provisional patent application, Ser. No. 60/216,790, filed on Jul. 7, 2000, and entitled "VERTICAL ADJUSTEMENT FOR ELECTROPLATING APPARATUS AND ASSOCIATED METHOD" (Incorporated herein by reference).

This is a continuation-in-part of prior filed U.S. patent application Ser. No. 09/289,074, filed Apr. 8, 1999, and entitled "ELECTRO-CHEMICAL DEPOSITION SYSTEM" now U.S. Pat. No. 6,258,220 (Incorporated herein by reference).

BACKGROUND OF THE INVENTION

1. Field of the Invention

The present invention generally relates to the deposition of a metal film on a substrate. More particularly, the present invention relates to positioning of a substrate holder used during deposition of a metal film on a substrate.

2. Background of the Related Art

Electroplating, previously limited to the fabrication of lines on integrated circuit boards, is now used to deposit metals on seed layers formed on substrates. The multiple layers deposited on a substrate during electroplating include a diffusion barrier layer, a seed layer, and a metal film. The metal film fills a feature formed in the seed layer on the substrate. One embodiment of a feature-fill process that involves electroplating comprises initially depositing the diffusion barrier layer over surfaces of the substrate that are to be electroplated by a process such as physical vapor deposition (PVD) or chemical vapor deposition (CVD). Next, a seed layer is deposited over the diffusion barrier layer by a process such as PVD or CVD. The metal film is then deposited over the seed layer on the substrate by electroplating. Finally, the deposited metal film can be planarized by another process such as chemical mechanical polishing (CMP), to define a conductive interconnect feature.

A profile of the deposited metal film, following electroplating, is a measure of the uniformity of the thickness of the metal film deposited at the different locations on the seed layer across the substrate. Usually the profile is taken from the periphery to the center of the seed layer on the substrate. The profile of the deposited metal film thus provides an indication of the uniformity of the deposition rate of the metal film deposited across the seed layer on the substrate. For example, a seed layer location on the substrate that has undergone a relatively heavy deposition of metal film has a thicker profile than a seed layer location on the substrate that has undergone a relatively light deposition of metal film. During the processing that follows the electroplating such as CMP, it is important to determine the profile of the metal film. The profiles can be used to determine the necessary further processing to compensate for varying plating depths and/or undesired cross-sectional shapes of the metal film deposited on the seed layer. For example, assume that a substrate, following processing, has a profile indicating the metal film deposited on the periphery of the substrate seed layer is thicker than the metal film deposited on the center of the substrate seed layer. During the CMP process, more polishing or etching is then performed on the deposited metal film at the periphery of the substrate than the metal film deposited at the center of the substrate to provide a more uniform thickness of metal film following CMP. This selective polishing or etching would be necessary to make the depth of the deposited metal film more consistent across the substrate. Following the CMP process, the profile should indicate a consistent depth of deposited metal film across the seed layer.

Depositing a metal film on an irregularly-shaped object has proven challenging. In certain prior electroplating systems, it has been attempted to control the profile of the deposited metal film on the substrate during the electroplating process. The more consistent the profile thickness of the deposited metal film across the substrate from the center to the periphery, the less polishing or etching has to be performed on the substrate by subsequent processes, such as CMP, to provide a deposited metal film having a uniform depth. Therefore, less wear is provided to the CMP equipment, and less CMP time is necessary if less polishing is necessary.

Electroplating has been applied to other areas than semiconductor processing, such as metal automobile bumpers. Generally during electroplating, the distance of a specific electroplated object point on the seed layer, through the electrolyte solution, to the anode is inversely related to the electric resistance through the electrolyte solution of that electroplated object point. The electric current density applied to the electroplated object point from the anode is a function of the distance between the anode and the electroplated object point. The deposition rate at the electroplated object point is directly related to the electric current density applied to that specific electroplated object point. Therefore, the deposition rate at a specific electroplated object point is inversely related to the distance to the nearest anode point. Providing a desired or consistent electroplated metal deposition rate across the electroplated object is challenging when different points on the electroplated object are located a considerable different distance away from the anode. For example, electroplating large, curved metal objects such as automobile bumpers is challenging since different points on the surface of the automobile bumper are located at considerably different distance away from the anode. If the electric field between the anode and object is not altered during plating, the electroplated object points that are located closest to the anode have the highest deposition rate.

Field-shaping devices, such as shutters and baffles, have been used to compensate non-uniformities in deposited depths rates resulting from different points on the object being electroplated being a different distance from the anode. The field-shaping devices modify the shape of the electric field within an electroplating system, so the electric field will enhance the uniformity of the deposition rate on irregularly-shaped objects. The use of such field-shaping devices as shutters and baffles, however, requires the complexity, maintenance, and expense associated with the insertion and use of another complex mechanical device into the electroplating system. An actuator is typically required to displace the field-shaping device to different positions to adjust for different deposition rates across the surface of the object being electroplated. Additionally, such field-shaping devices as shutters and baffles are often not concentric with the electroplater to enhance the electric field applied to irregularly-shaped objects. The non-concentric shaped field-shaping device therefore often provide other unintended alterations to the electric field within the electrolyte solution that result in other inconsistencies to the deposition rate applied to the seed layer on the substrate.

Another field-shaping process involves electroplating the substrates in one of multiple cells have different shapes or diameters. The different cells therefore each generate an electric field having a different shape. If a substrate shows an undesired profile of metal film deposition on the seed layer after being processed in one electroplating cell, for example, then other similarly sized and configured substrates can be processed in another cell having a different diameter or shape. Different electroplating cells having a different diameters or dimensions produce a different electric field. Changing cells to provide different electric fields requires the expense and time associated with both the use of multiple electroplating cells and changing the cells. There is also the possibility that none of the electroplating cells provide the desired plating characteristics.

Therefore, there remains a need to provide a simple mechanism to control the electric current density of the seed layer on a substrate, from the center to the periphery during electro-chemically deposition of a metal film on the seed layer. The profile of the metal film deposited across the seed layer on the substrate is directly related to the electric current density at the different seed layer locations across the substrate.

SUMMARY OF THE INVENTION

The invention generally provides a method and associated apparatus for electro-chemically depositing a metal film on a substrate having a metal seed layer. The apparatus comprises a substrate holder that holds the substrate. The electrolyte cell receives the substrate in a processing position. The actuator is connected to the substrate holder and adjustably positions the substrate relative to the electrolyte cell. The method involves electro-chemically depositing a metal film on a substrate having a metal seed layer comprising disposing the substrate in an electrolyte cell that is configured to receive the substrate. The method also comprises adjustably positioning the substrate relative to the electrolyte cell to provide a desired deposition uniformity across the seed layer on the substrate. In one aspect, the adjustably positioning the substrate may involve vertically positioning the substrate within the electrolyte cell.

BRIEF DESCRIPTION OF THE DRAWINGS

It is to be noted, however, that the appended drawings illustrate only typical embodiments of this invention and are therefore not to be considered limiting of its scope, for the invention may admit to other equally effective embodiments.

FIG. 13 is a partial cross sectional view of one embodiment of a substrate holder plate;

Figure 1:
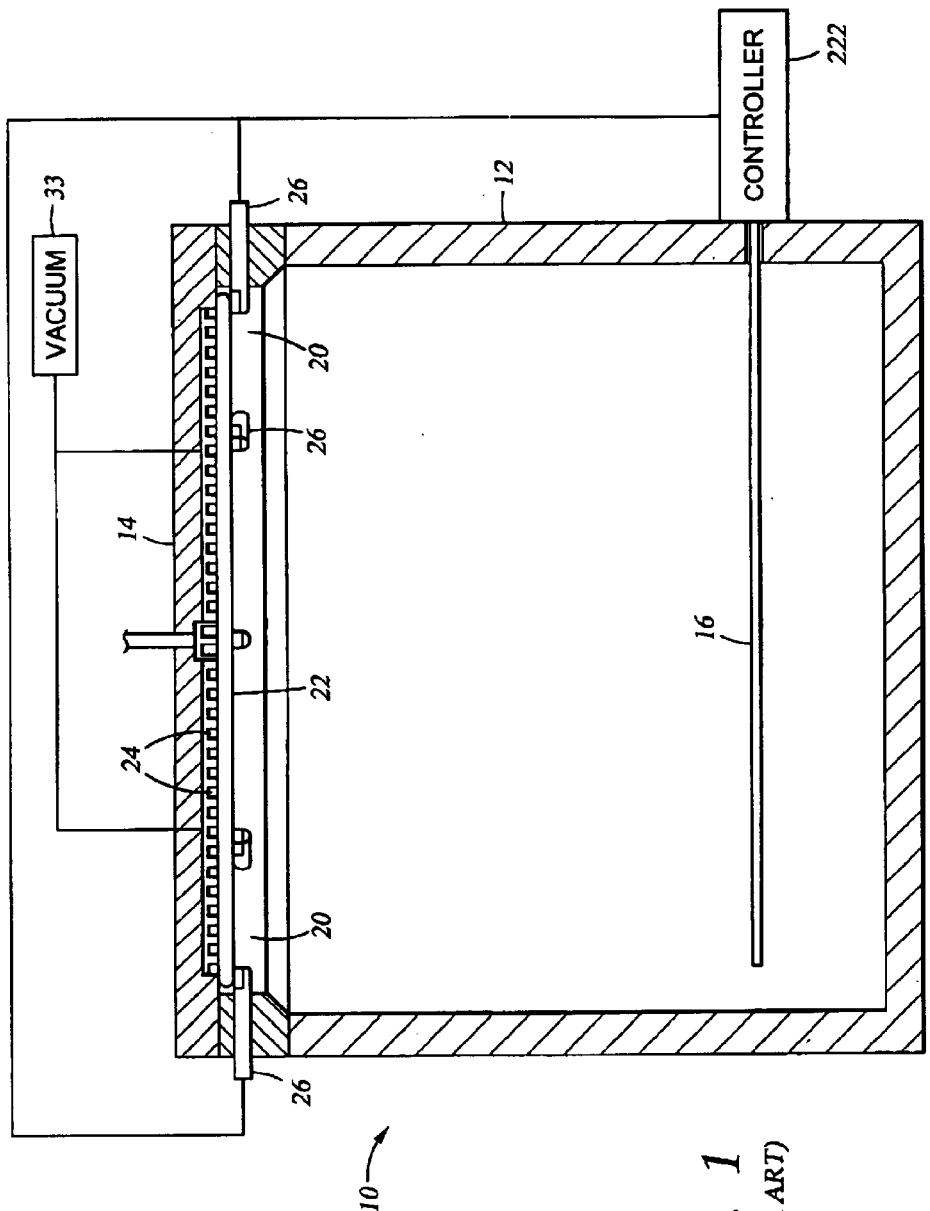
FIG. 1 is a cross sectional view of a simplified typical fountain plater.

The terms "above", "below", "bottom", "up", "down", "upper", "lower" and other such positional terms as used herein are described with respect to the embodiments shown in the figures and may be varied depending upon then relative orientation of the processing apparatus.

To facilitate understanding, identical reference numerals have been used, where possible, to designate identical elements that are common to the figures.

DETAILED DESCRIPTION OF THE PREFERRED EMBODIMENT

In the following description, multiple embodiments of electro-chemical plating (ECP) system 200 are described.

The operation of the substrate holder device is described in a manner that enhances the uniformity of deposition across the face of the seed layer. A substrate is described as the object being electroplated. The term "substrate" may relate to any semiconductor wafer, substrate, or object. The substrates are generally cylindrical or rectangular in configuration, and may include such irregularities to the general configuration as notches or flatted surfaces that assist in processing. The term "substrate" may also include large light emitting diode (LED) panels such as commonly used in computer and television display panels.

Figure 2:
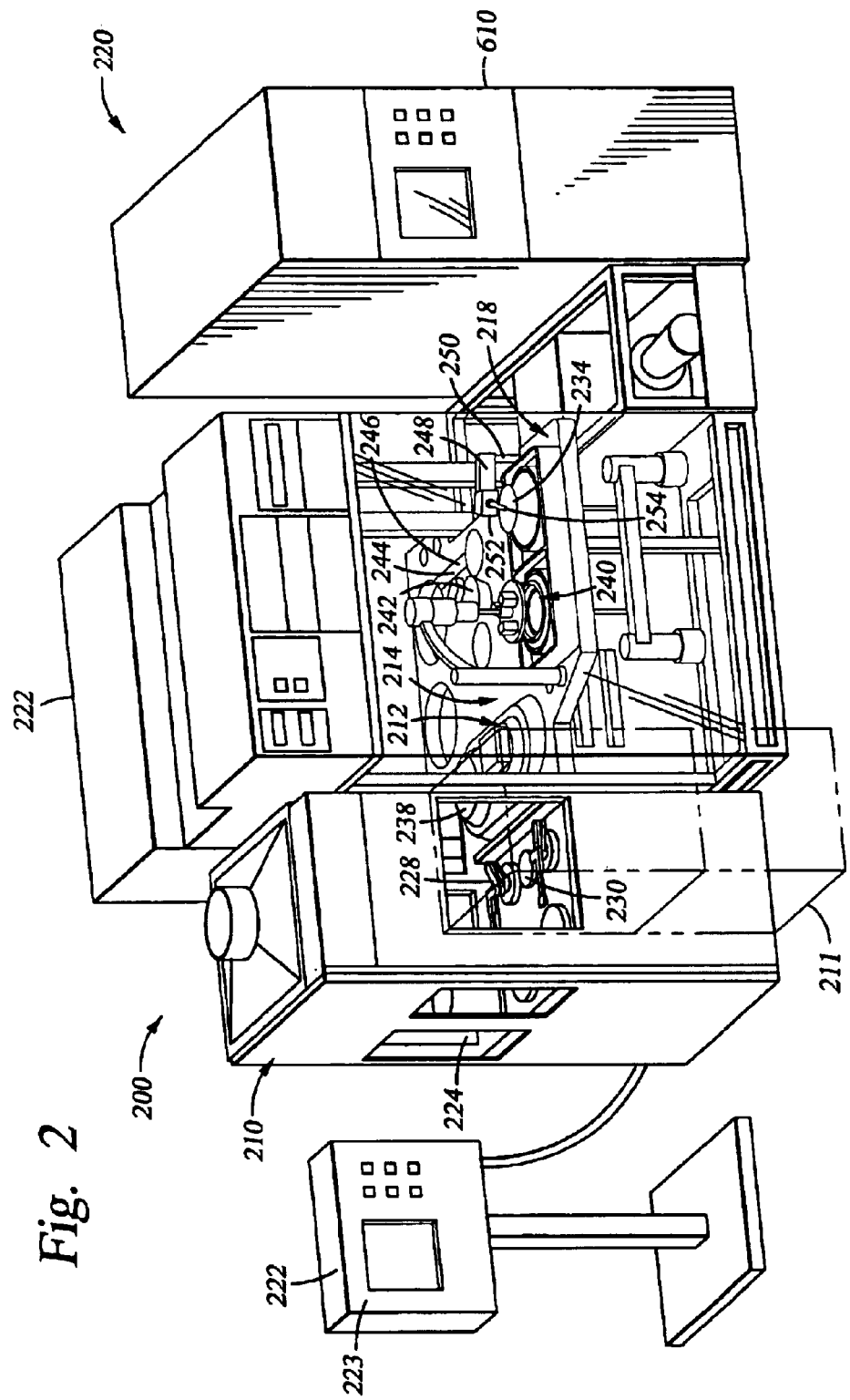
FIG. 2 is a perspective view of one embodiment of electro-chemical plating (ECP) system.
Figure 3:
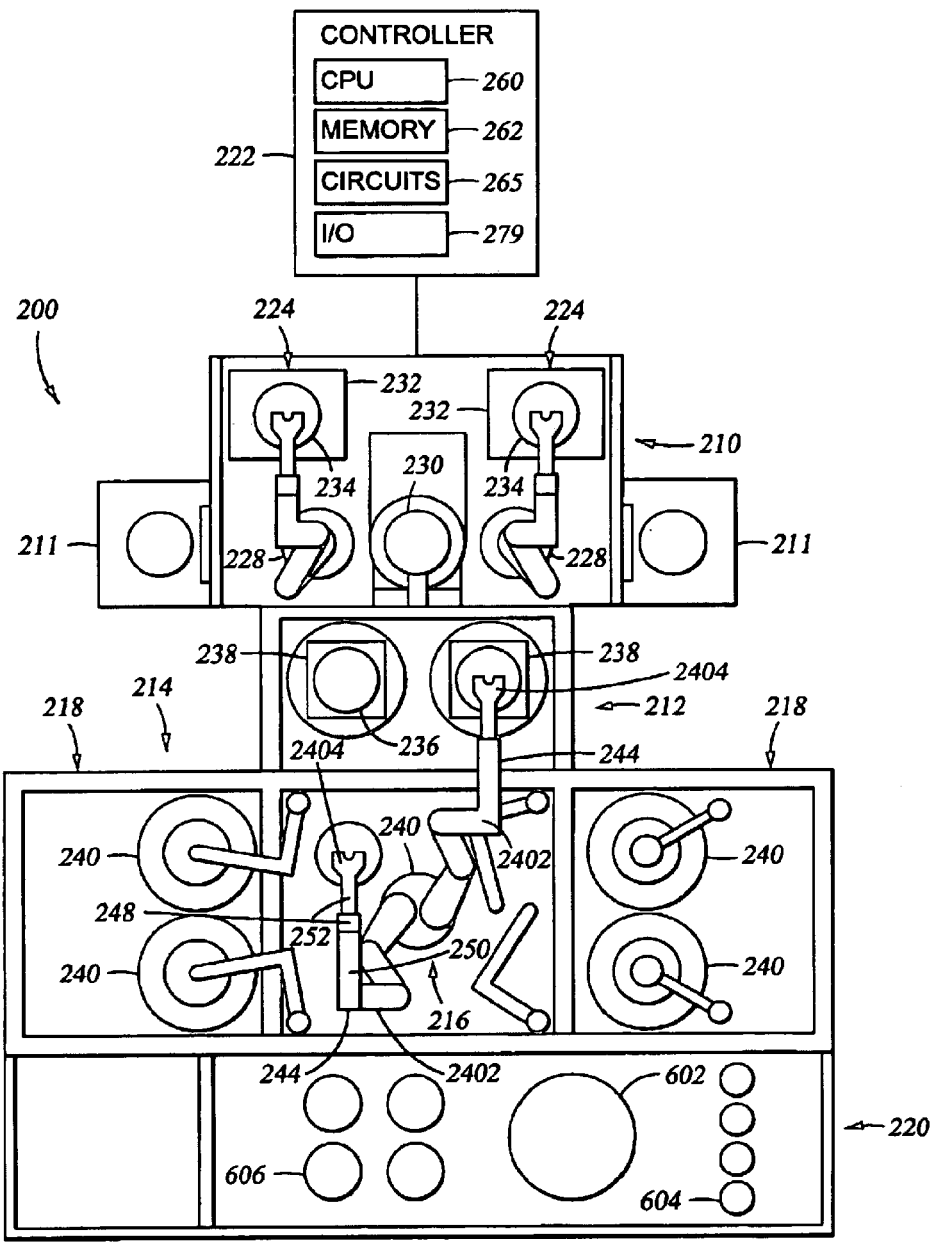
FIG. 3 is a top schematic view of the ECP system shown in FIG. 2.

In general, this disclosure relates to positioning a substrate within the electrolyte solution contained within an electrolyte cell as a position to control the electroplating process. In one embodiment, the vertical height of the seed layer on the substrate is adjusted to modify the electric current density applied across the seed layer. The structure and operation of multiple embodiments of electroplating systems, such as the fountain plater 10 shown in FIG. 1 and the electroplating system platform 200 of FIGS. 2 and 3, are described. Multiple embodiments of positioning the substrate seed layer are also described.

FIG. 1 shows one embodiment of fountain plater 10 used in electroplating. The fountain plater 10 includes an electrolyte cell 12, a substrate holder 14, an anode 16, and a contact ring 20. The electrolyte cell 12 contains electrolyte solution, and the electrolyte cell has a top opening 21 circumferentially defined by the contact ring 20. The substrate holder 14 is disposed above the electrolyte cell, and is capable of displacing the substrate to be immersed into, and out of, the electrolyte solution. The substrate holder enters, and is removed from, the electrolyte solution, through the top opening of the electrolyte cell. The substrate holder 14 is also capable of securing and positioning the substrate in a desired position within the electrolyte solution during processing. The contact ring 20 comprises a plurality of metal or metal alloy electric contacts that electrically contact the seed, layer on the substrate. A controller 222 is separately connected electrically to both each of the plurality of contacts and to the anode. The controller provides an electric current to the substrate when the seed layer on the substrate is being plated. The controller thereby determines the electric current/voltage established across from the anode to the seed layer on the substrate. During operation of the fountain plater 10, the substrate 22 is positioned above the anode and an electric current is established from the anode to the seed layer on the substrate.

The seed layer is the deposited layer on the substrate where metal film is deposited when the seed layer is immersed in the electrolyte solution. The seed layer is charged with a sufficient negative voltage relative to the anode to cause the deposition of metal film on the seed layer (the plating) when sufficient negative voltage is applied from the substrate through the electrolyte solution relative to the anode. Such negative voltage is known as "plating voltage". Applying the plating voltage across the electrolyte solution is sufficient to break the ionic bonds in the copper sulfate between the positively charged copper ions and the negatively charged sulfate ions within the volume of the electrolyte solution contained in a depletion region. The depletion region is located proximate the seed layer on the substrate. A large number of positively charged copper ions are deposited on the negatively charged seed layer on the substrate. The deposition of the copper ions from within the depletion regions results in the depletion of copper ions within the depletion region during the plating process. The voltage established within the electrolyte cell from the anode to the seed layer on the substrate causes a current to flow through the electrolyte solution from the anode to the seed layer. An atom-level electron exchange, associated with the current, drives copper atoms contained in the anode into the electrolyte solution from the anode, the anode is typically a solid piece of copper.

The local voltages in the electrolyte solution adjacent the seed layer on the substrate are relatively small, on the order of 1 volt, so the copper ions arrive at the seed layer surface on the substrate primarily by diffusion of the copper ions within the electrolyte solution. The voltage level of the seed layer causes the copper ions to deposit on the seed layer to form a metal film. A higher voltage established between the anode and the seed layer on the substrate forces more ions into the electrolyte solution, resulting in a higher deposition rate of metal ions being deposited on the seed layer on the substrate. The voltage between the anode and the seed layer affects the deposition rate of the seed layer only to the diffusion limit where all of the diffused ions are converted into copper ions. Above the diffusion limit, a further increase in the voltage between the anode and the seed layer results in breaking down the bonds of the water in the electrolyte solution. Such an increase in voltage above the diffusion limit does not improve the deposition rate of the metal film on the seed layer. If there is no recirculation or replenishment within the electrolyte cell 212, eventually the size of the depletion regions would expand as more copper ions are deposited from the electrolyte solution onto the seed layer over time. Maintaining a flow of refreshed electrolyte solution past the seed layer thereby refreshes the chemicals in the electrolyte solution, and diminishes the dimensions of the depletion region.

FIG. 2 is a perspective view of one embodiment of electroplating system platform 200. FIG. 3 is a schematic view of the electroplating system platform 200 shown in FIG. 2. FIGS. 2 and 3 should be viewed together. The electroplating system platform 200 generally comprises a loading station 210, a thermal anneal chamber 211, a spin-rinse-dry (SRD) station 212, a mainframe 214, and an electrolyte solution replenishing system 220. Preferably, the electroplating system platform 200 is enclosed in a clean environment using panels such as PLEXIGLAS® (a registered trademark of Rohrn and Haas Company of West Philadelphia, Pa.). The mainframe 214 generally comprises a mainframe transfer station 216 and a plurality of processing stations 218. Each processing station 218 includes one or more processing cells 240. An electrolyte solution replenishing system 220 is positioned adjacent the electroplating system platform 200 and connected to the process cells 240 individually to circulate electrolyte solution used for the electroplating process. The electroplating system platform 200 also includes a controller 222, typically comprising a programmable microprocessor.

Figure 6:
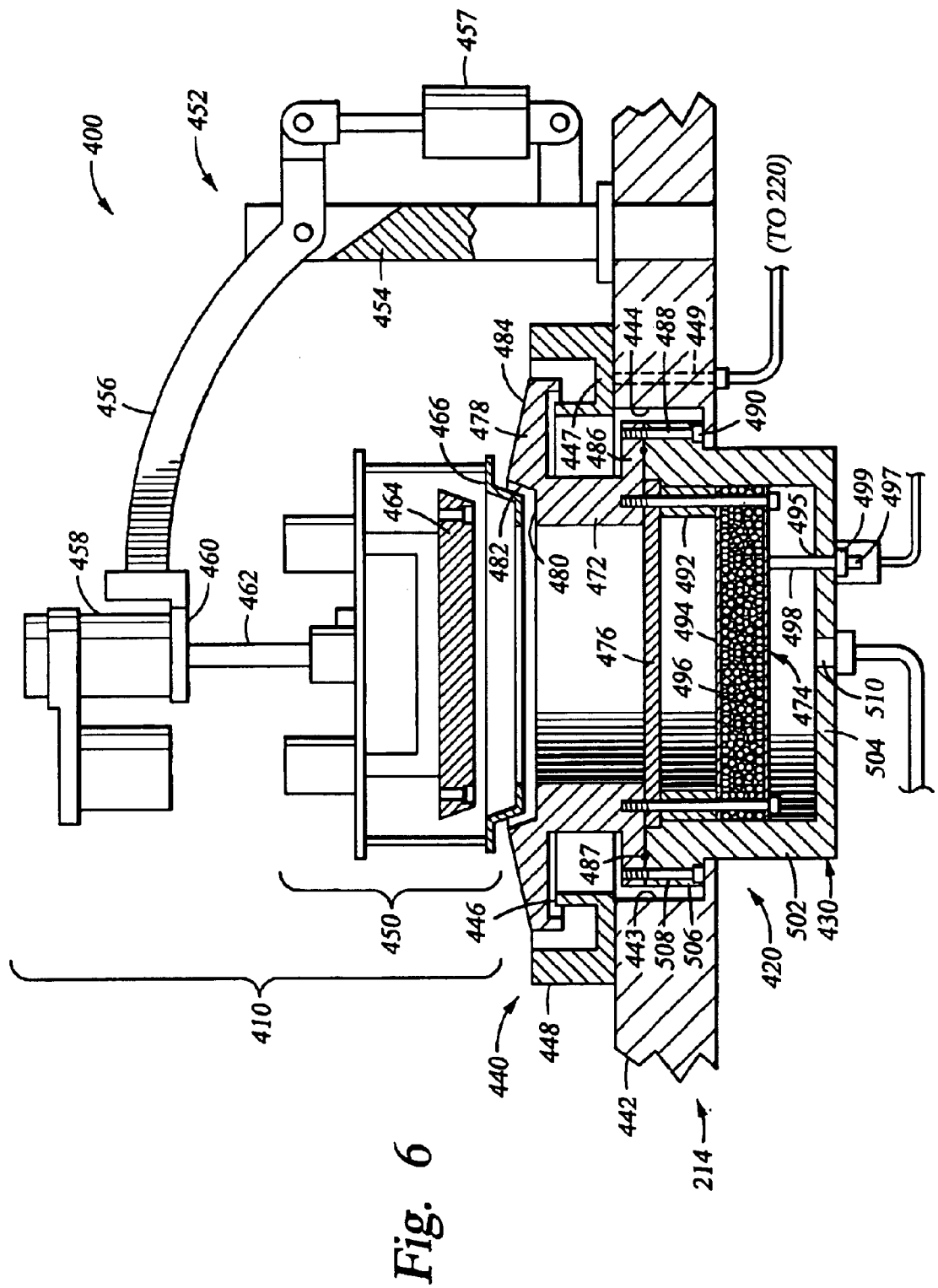
FIG. 6 is a cross sectional view of one embodiment of electroplating process cell.

The controller 222 as shown in FIG. 3 comprises a central processing unit (CPU) 260, memory 262, circuit portion 264, input output interface (I/O) 264, and bus, not shown. The controller 222 may be a general-purpose computer, a microprocessor, a microcontroller, or any other known suitable type of computer or controller. The CPU 260 performs the processing and arithmetic operations for the controller 222. The controller 222 controls the processing, robotic operations, valve operations, timing, etc. associated with the electroplating system platform 200. The controller 222 controls the voltage applied to the anode 16, the plating surface 15 of the substrate 22, and the operation of the substrate holder assembly 450 as shown in FIG. 6.

The memory 262 includes random access memory (RAM) and read only memory (ROM) that together store the computer programs, operands, operators, dimensional values, system processing temperatures and configurations, and other parameters that control the electroplating operation. The bus provides for digital information transmissions between CPU 260, circuit portion 264, memory 262, and I/O 264. The bus also connects I/O 264 to the portions of the ECP system 200 that either receive digital information from, or transmit digital information to, controller 222.

I/O 264 provides an interface to control the transmissions of digital information between each of the components in controller 222. I/O 264 also provides an interface between the components of the controller 222 and different portions of the ECP system 200. Circuit portion 264 comprises all of the other user interface devices, such as display and keyboard.

The loading station 210 preferably includes one or more substrate cassette receiving areas 224, one or more loading station transfer robots 228 and at least one substrate orientor 230. The number of substrate cassette receiving areas, loading station transfer robots 228 and substrate orientors included in the loading station 210 can be configured according to the desired throughput of the system. As shown for one embodiment in FIGS. 2 and 3, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the electroplating system platform. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211.

Figure 4:
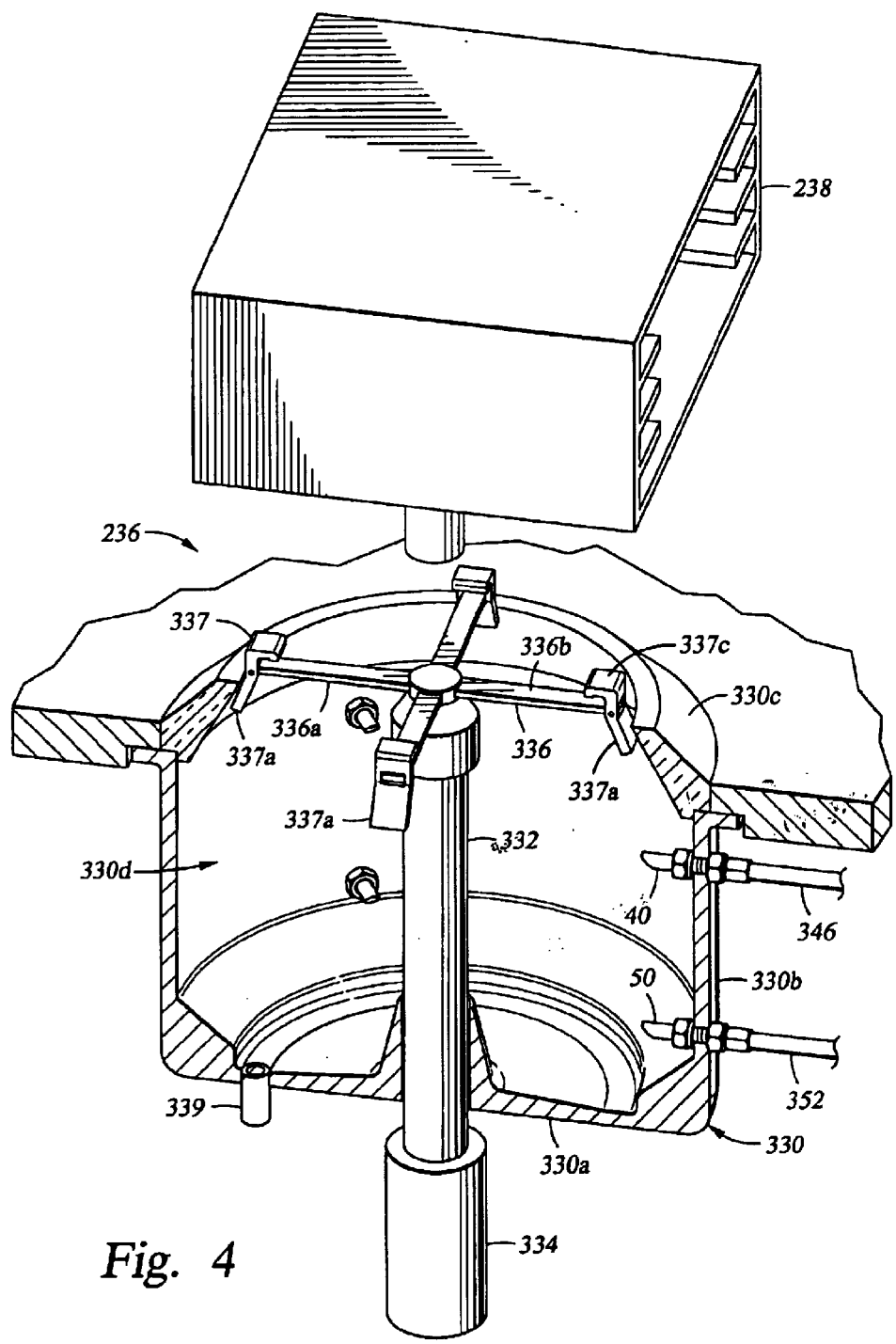
FIG. 4 is a schematic perspective view of one embodiment of spin-rinse-dry (SRD) module, incorporating rinsing and dissolving fluid inlets.
Figure 5:
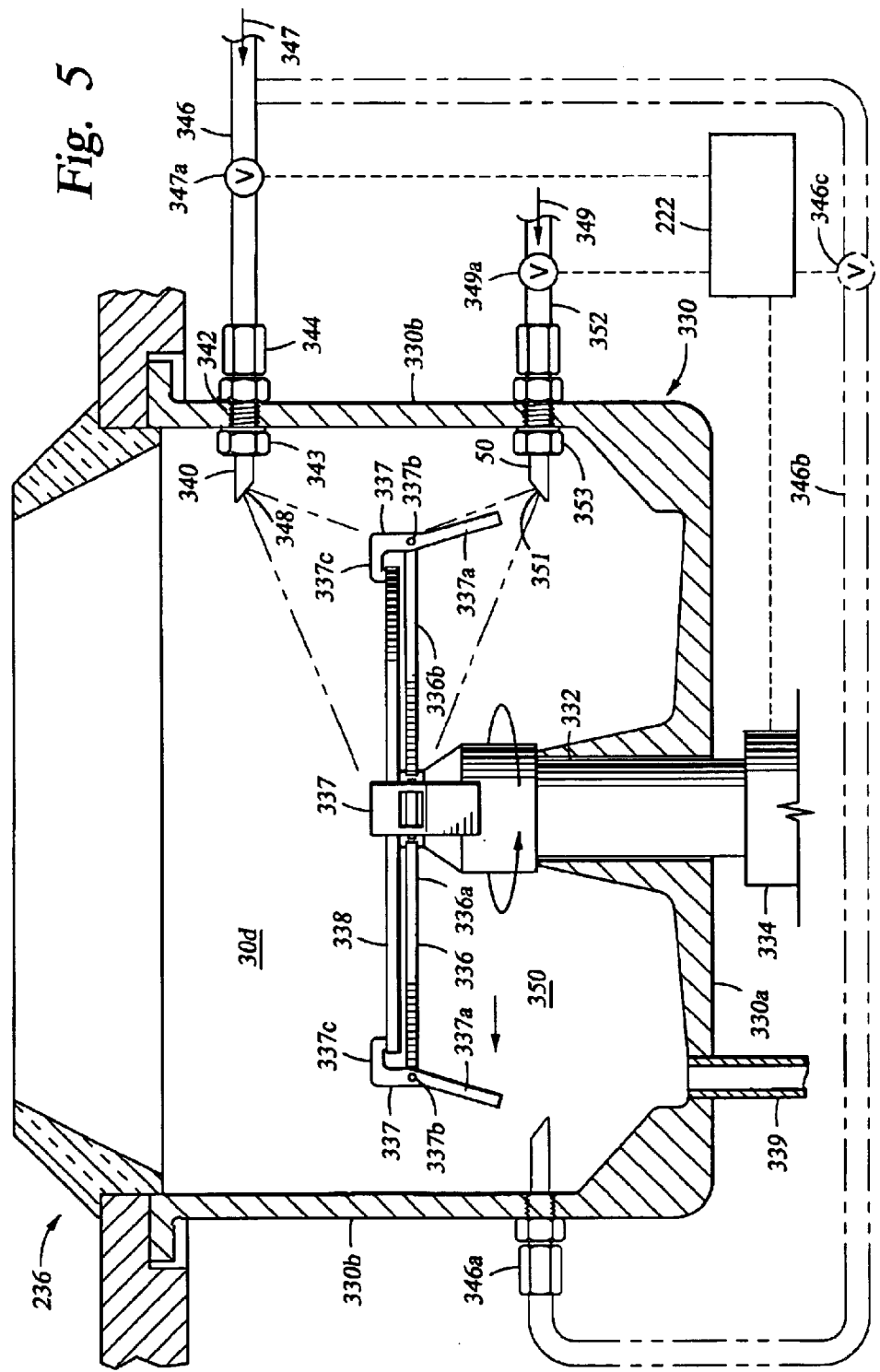
FIG. 5 is a side cross sectional view of the spin-rinse-dry (SRD) module of FIG. 4 and shows a substrate in a processing position vertically disposed between fluid inlets.

FIG. 4 is a schematic perspective view of one embodiment of spin-rinse-dry (SRD) module, incorporating rinsing and dissolving fluid inlets. FIG. 5 is a side cross sectional view of the spin-rinse-dry (SRD) module of FIG. 4 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

Referring to FIGS. 4 and 5, the SRD module 238 comprises a bottom 330a and a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338, shown in FIG. 5, on the pedestal upper surface during processing. The pedestal actuator 334 rotates the pedestal to spin the substrate and raises and lowers the pedestal as described below. The substrate may be held in place on the pedestal by a plurality of clamps 337. The clamps pivot with centrifugal force and engage the substrate preferably in the edge exclusion zone of the substrate. In a preferred embodiment, the clamps engage the substrate only when the substrate lifts off the pedestal during the processing. Vacuum passages, not shown, may also be used as well as other holding elements. The pedestal has a plurality of pedestal arms 336a and 336b, so that the fluid through the second nozzle may impact as much surface area on the lower surface on the substrate as is practical. An outlet 339 allows fluid to be removed from the SRD module.

A first conduit 346, through which a first fluid 347 flows, is connected to a valve 347a. The conduit may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 222. The conduit 346 connects to a first fluid inlet 340 that is located above the substrate and includes a mounting portion 342 to attach to the SRD module and a connecting portion 344 to attach to the conduit 346. The first fluid inlet is shown with a single first nozzle 348 to deliver a first fluid 347 under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module at a variety of positions. For instance, if the flow can be directed at any angle toward the center of the substrate or toward the periphery of the substrate depending upon the desired SRD process.

The controller 222 could individually control the two fluids in the SRD module, and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c. The alternate embodiment may be used to flow a rinsing fluid on the backside of the substrate after the dissolving fluid is applied. The rinsing fluid may be applied without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot, not shown, places the substrate, front side up, onto the pedestal. The pedestal lowers the substrate to a processing position where the substrate is disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material, dissolves, and then flushes the material away from the substrate backside, and flushes the material away from other areas that any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) (for a 200 mm substrate).

The SRD system can also be used to remove the unwanted deposits along the edge of the substrate to create an edge exclusion zone. The unwanted deposits could be removed from the edge and/or edge exclusion zone of the substrate by adjustment of the orientation and placement of the nozzles, the flow rates of the fluids, the rotational speed of the substrate, and the chemical composition of the fluids. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired.

One method of accomplishing the edge exclusion zone dissolution process is to rotate the substrate at a speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process described above.

The SRD module 238 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two processing cells 240. The mainframe transfer station 216 includes a mainframe transfer robot 242. Preferably, the mainframe transfer robot 242 comprises a plurality of individual robot arms 244 that provides independent access of substrates in the processing stations 218 and the SRD stations 212. As shown in FIG. 3, the mainframe transfer robot 242 comprises two robot arms 244, corresponding to the number of processing cells 240 per processing station 218. Each robot arm 244 includes a robot blade 246 for holding a substrate during a substrate transfer. Preferably, each robot arm 244 is operable independently of the other arm to facilitate independent transfers of substrates in the system. Alternatively, the robot arms 244 operate in a coordinated fashion such that one robot extends as the other robot arm retracts.

Preferably, the mainframe transfer station 216 includes a flipper robot 248. The flipper robot facilitates transfer of a substrate from a face-up position on the robot blade 246 of the mainframe transfer robot 242 to a face down position for a process cell 240 that requires facedown processing of substrates. The flipper robot 248 includes a main body 250 that provides both vertical and rotational movements with respect to a vertical axis of the main body 250 and a flipper robot arm 252 that provides rotational movement along a horizontal axis along the flipper robot arm 252. Preferably, a vacuum suction gripper 254, disposed at the distal end of the flipper robot arm 252, holds the substrate as the substrate is flipped and transferred by the flipper robot 248. The flipper robot 248 positions a substrate 234 into the processing cell 240 for face-down processing. The details of the electroplating processing cell will be discussed below.

Figure 24:
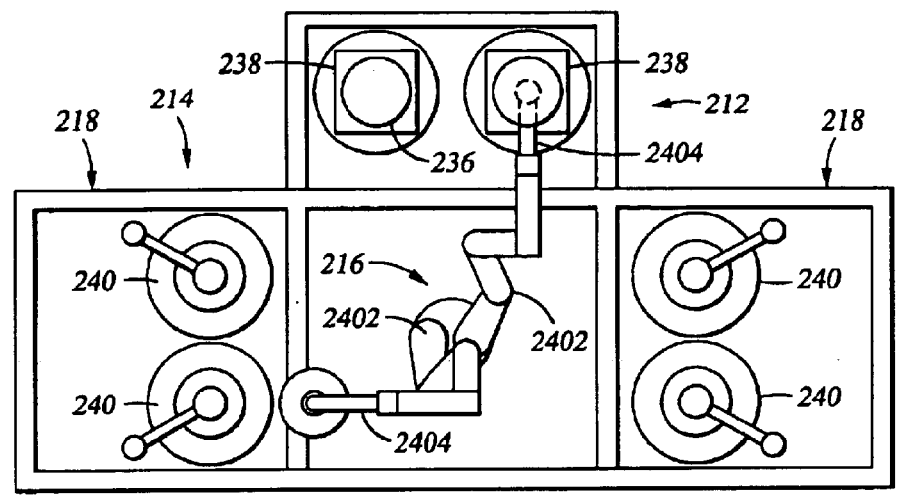
FIG. 24 is a top schematic view of one embodiment of a mainframe transfer robot having a flipper robot incorporated therein.
Figure 29:
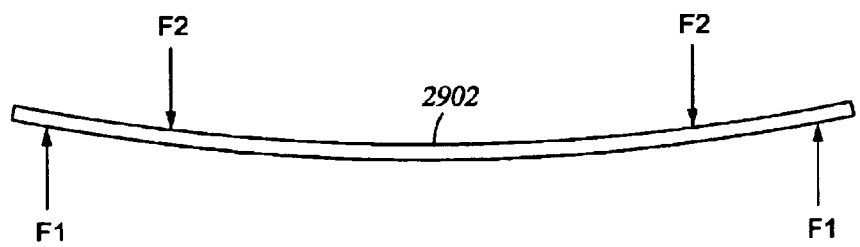
FIG. 29 is a side view of one embodiment of the forces applied to a substrate by the rotatable head assembly shown in FIG. 27 to effect bowing of the substrate.

FIG. 24 is a top schematic view of a mainframe transfer robot having a flipper robot incorporated therein. The mainframe transfer robot 242 as shown in FIG. 24 serves to transfer substrates between different stations attached the mainframe station, including the processing stations and the SRD stations. The mainframe transfer robot 242 includes a plurality of robot arms 2402, two shown, and a flipper robot 2404 is attached as an end effector for each of the robot arms 2402. Flipper robots are generally known in the art and can be attached as end effectors for substrate handling robots, such to as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation, i.e., substrate processing surface being face-down for the electroplating process. Preferably, the mainframe transfer robot 242 provides independent robot motion along the X-Y-Z axes by the robot arm 2402 and independent substrate flipping rotation by the flipper robot end effector 2404. By incorporating the flipper robot 2404 as the end effector of the mainframe transfer robot, the substrate transfer process is simplified because the step of passing a substrate from a mainframe transfer robot to a flipper robot is eliminated.

FIG. 6 is a cross sectional view of an electroplating process cell 400. The electroplating process cell 400 as shown in FIG. 6 is similar in operation to the electroplating process cell 240 as shown in FIGS. 2 and 3. The processing cell 400 generally comprises a head assembly 410, a process cell 420 and an electrolyte solution collector 440. Preferably, the electrolyte solution collector 440 is secured onto the body 442 of the mainframe 214 over an opening 443 that defines the location for placement of the process cell 420. The electrolyte solution collector 440 includes an inner wall 446, an outer wall 448 and a bottom 447 connecting the walls. An electrolyte solution outlet 449 is disposed through the bottom 447 of the electrolyte solution collector 440 and connected to the electrolyte solution replenishing system 220, shown in FIG. 2, through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process cell 420 to provide the spacing required to remove and/or replace the process cell 420 from the electroplating process cell 400. When the cantilever arm actuator 457 is extended, the cantilever arm 456 moves the head assembly 410 toward the process cell 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
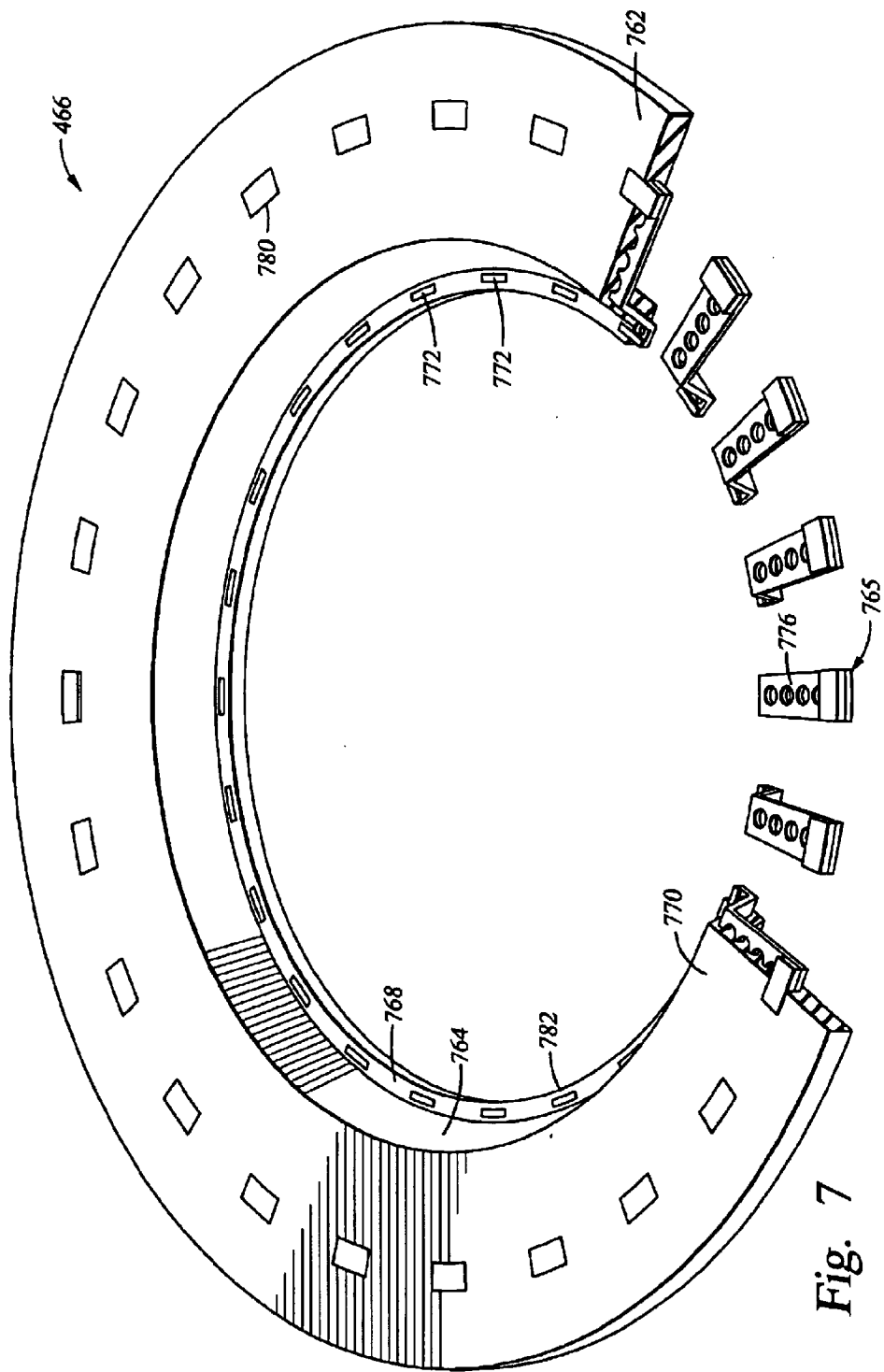
FIG. 7 is a partial cross sectional perspective view of one embodiment of an electric contact element.

The substrate holder assembly 450 generally comprises a substrate holder 464 and a cathode contact ring 466. FIG. 7 is a cross sectional view of one embodiment of a cathode contact ring 466. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762. The flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electric contact pads 780 annularly disposed on the flange 762, a plurality of inner electric contact pads 772 disposed on a portion of the substrate seating surface 768, and a plurality of embedded conducting connectors 776 which link the pads 772, 780 to one another. The conducting members 765 are isolated from one another by the insulative body 770. The insulative body may be made of a plastic such as polyvinylidenefluoride (PVDF), perfluoroalkoxy resin (PFA), TEFLON® (a trademark of the E. I. duPont de Nemoirs Company of Wilmington, Del.), and Tefzel™, or any other insulating material such as Alumina ($Al_2O_3$) or other ceramics. The outer contact pads 780 are coupled to a power supply (not shown) to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper, resistivity for copper is approximately $2\times10^{-8}$ Ω.m, and be coated with platinum, resistivity for platinum is approximately $10.6\times10^{-8}$ Ω.m. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation that acts as an insulator, the inner contact pads 772 preferably comprise a material resistant to oxidation such as Pt, Ag, or Au.

Figures 8, 9:
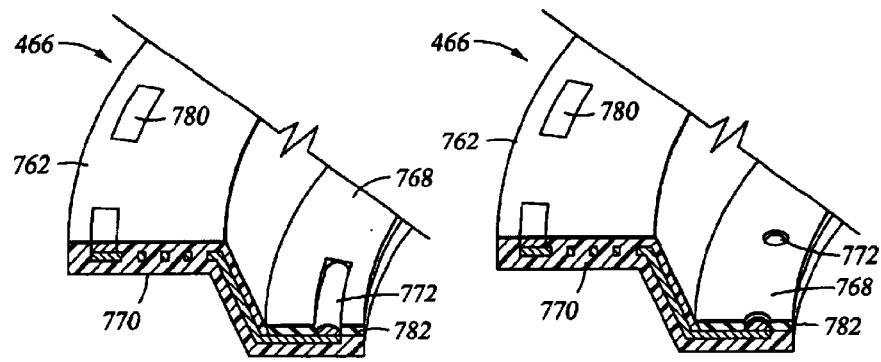
FIG. 8 is a cross sectional perspective view of the electric contact element showing an alternative embodiment of contact pads.
FIG. 9 is a cross sectional perspective view of the electric contact element showing an alternative embodiment of the contact pads and an isolation gasket.

In addition to being a function of the contact material, the total resistance of each circuit is dependent on the geometry, or shape, of the inner contact inner contact pads 772 and the force supplied by the contact ring 466. These factors define a constriction resistance, $R_{CR}$, at the interface of the inner contact pads 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes that may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 776 may be varied depending on the particular number of contact pads 772, shown in FIG. 7, desired. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions of the process cells are readily altered to suit a particular application, for example, a 300 mm substrate, the optimal number may easily be determined for varying scales and embodiments.

Figure 10:
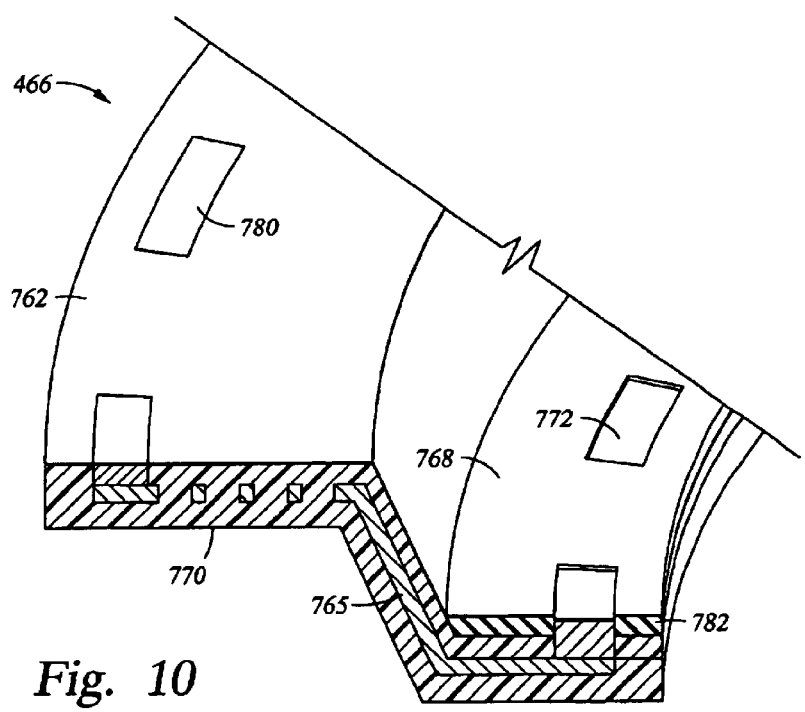
FIG. 10 is a cross sectional perspective view of the electric contact element showing the isolation gasket.

As shown in FIG. 10, the substrate seating surface 768 comprises an isolation gasket 782. The isolation gasket is disposed on the insulative body 770 and extends diametrically interior to the inner contact pads 772 to define the inner diameter of the contact ring 466. The isolation gasket 782 preferably extends slightly above the inner contact pads 772 e.g., a few mil, and preferably comprises an elastomer such as VITON® (a registered trademark of the E. I. duPont de Nemoirs and Company of Wilmington, Del.), TEFLON®, buna rubber and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 that may be advantageous where material costs are significant such as when the inner contact pads 772 comprise gold.

During processing, the isolation gasket 782 maintains contact with a peripheral portion of the substrate plating surface and is compressed to provide a seal between the remaining cathode contact ring 466 and the substrate. The seal prevents the electrolyte solution from contacting the edge and backside of the substrate. As noted above, maintaining a clean contact surface is necessary to achieving high plating repeatability. Previous contact ring designs did not provide consistent plating results because contact surface topography varied over time. The contact ring eliminates, or substantially minimizes, deposits which would otherwise accumulate on the inner contact pads 772 and change their characteristics thereby producing highly repeatable, consistent, and uniform plating across the substrate plating surface.

Figure 11:
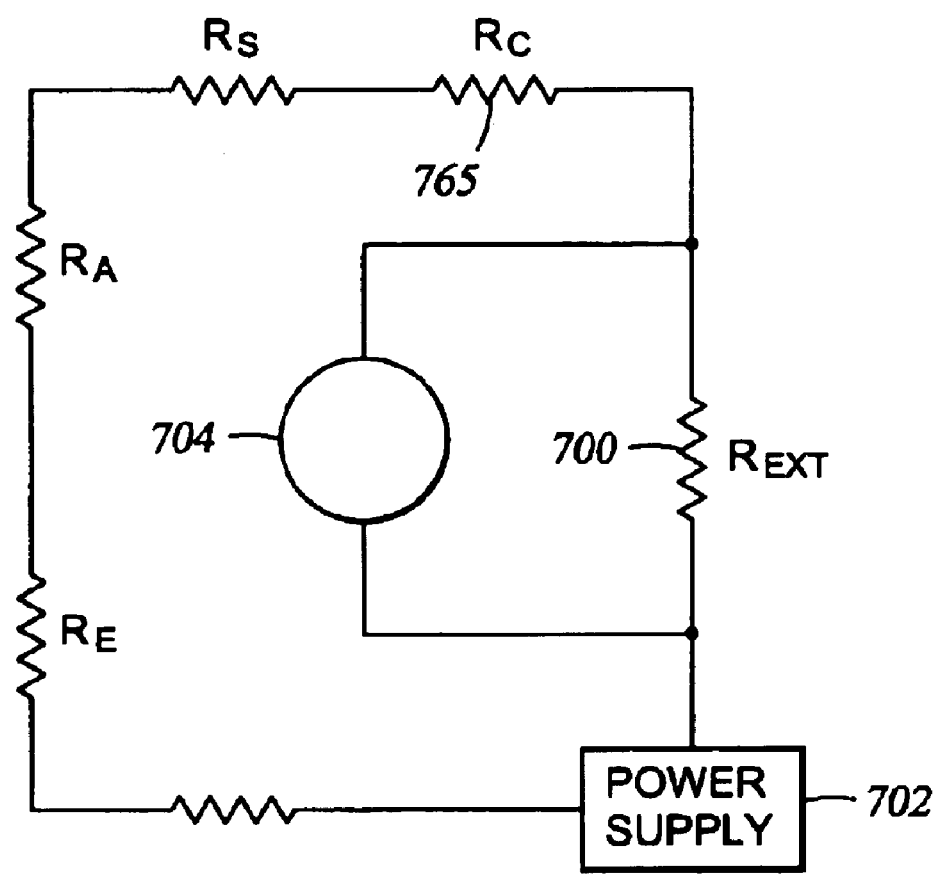
FIG. 11 is a simplified schematic diagram of the electric circuit representing the ECP system through each contact pin.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700, represented as $R_{EXT}$, is much greater than the resistance of any other component of the circuit. As shown in FIG. 11, the electrical circuit through each conducting member 765 is represented by the resistance of each of the components connected in series with the power supply 702. $R_E$ represents the resistance of the electrolyte solution, which is typically dependent on the distance between the anode and the cathode contact ring and the chemical composition of the electrolyte solution. Thus, $R_A$ represents the resistance of the electrolyte solution adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor, $R_{EXT}$, is at least as much as $\Sigma R$, where $\Sigma R$ equals the sum of $R_E$, $R_A$, $R_S$ and $R_C$. Preferably, the resistance value of the external resistor, $R_{EXT}$, is much greater than $\Sigma R$ such that $\Sigma R$ is negligible and the resistance of each series circuit approximates $R_{EXT}$.

Typically, one power supply is connected to all of the outer contact pads 780 of the cathode contact ring 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electric current passed through each conducting member 765 becomes controlled mainly by the value of the external resistor. As a result, the variations in the electric properties between each of the inner contact pads 772 do not affect the current distribution on the substrate. The uniform current density applied across the plating surface contributes to a uniform plating thickness of the metal film deposited on the seed layer on the substrate. The external resistors also provide a uniform current distribution between different substrates of a process-sequence.

Although the contact ring 466 is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

Figure 18:
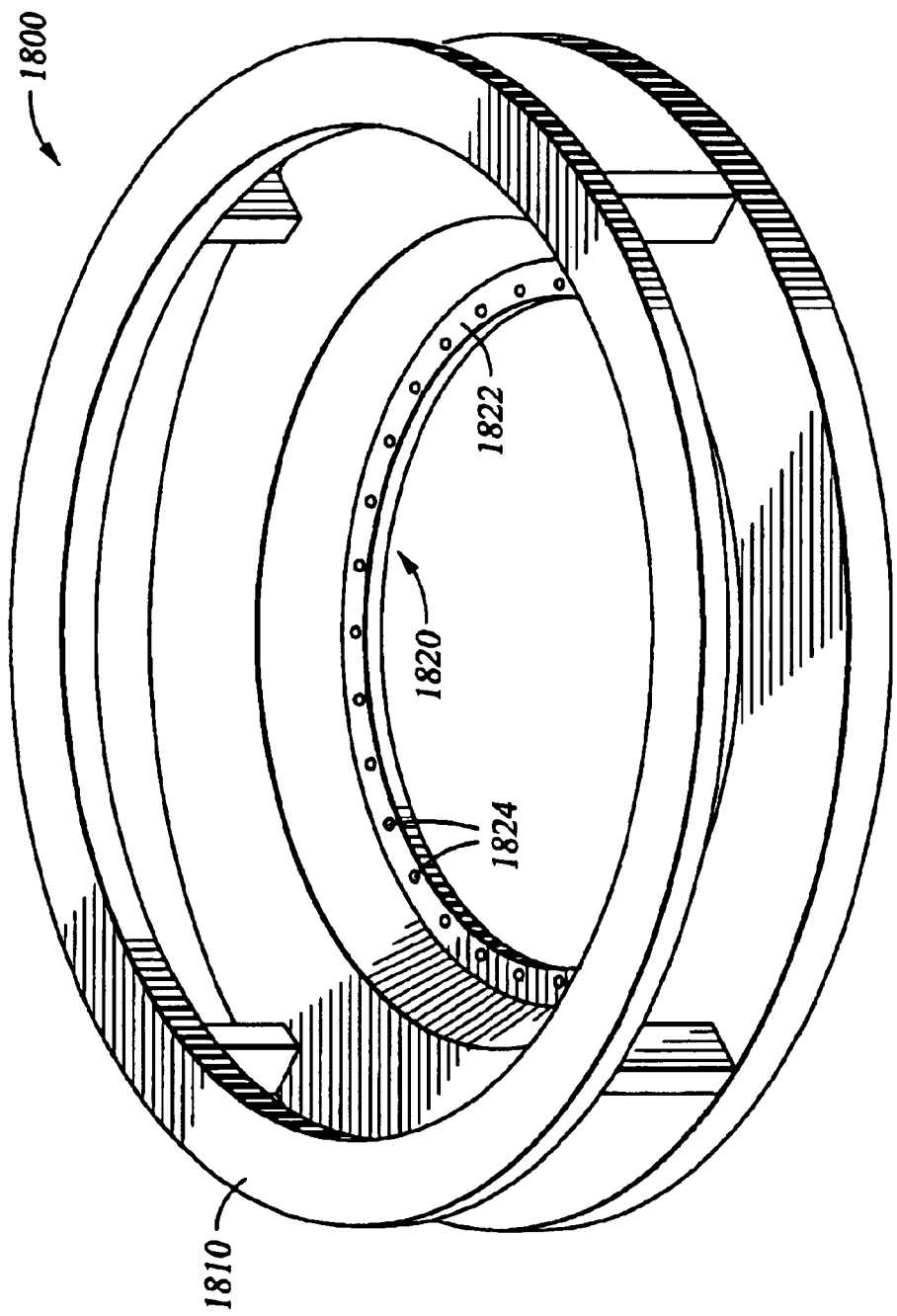
FIG. 18 is a perspective view of an alternative embodiment of a electric contact element.

FIG. 18 is a perspective view of an alternative embodiment of a cathode contact ring. The cathode contact ring 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electric contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that contact the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte solution on the surfaces of the cathode contact ring and promotes smooth dripping of the electrolyte solution from the cathode contact ring, after the cathode contact ring is removed from the electroplating bath or electrolyte solution. By providing hydrophilic surfaces on the cathode contact ring that facilitate run-off of the electrolyte solution, plating defects caused by residual electrolyte solution on the cathode contact ring are significantly reduced. The inventors also contemplate application of this hydrophilic treatment or coating in other embodiments of cathode contact rings to reduce residual electrolyte solution beading on the cathode contact ring and the plating defects on a subsequently processed substrate that may result therefrom.

Figure 12:
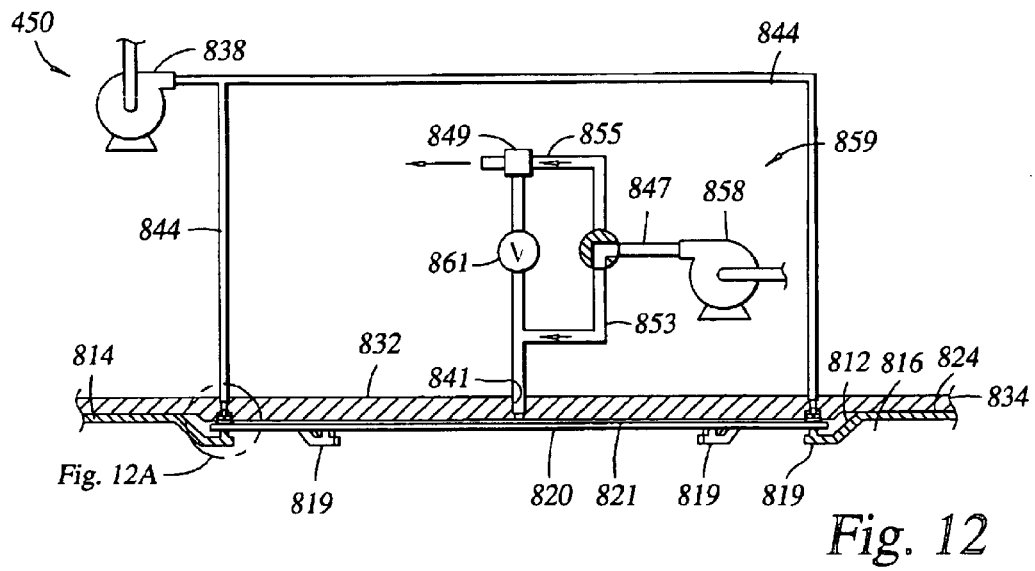
FIG. 12 is a cross sectional view of one embodiment of a substrate assembly.
Figure 12A:
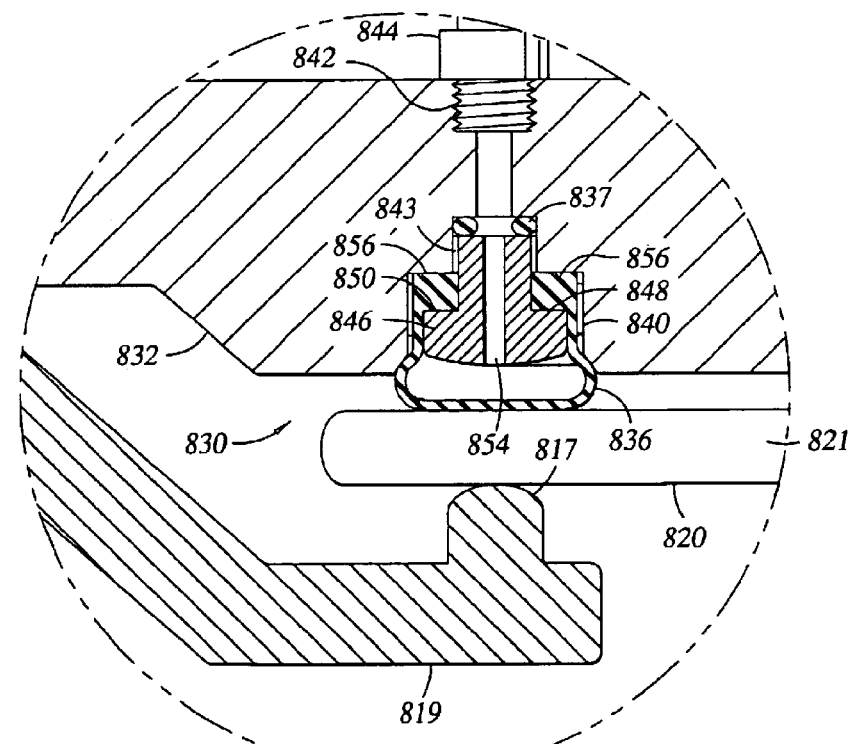
FIG. 12A is an enlarged cross sectional view of the bladder area of FIG. 12.

Referring to FIGS. 12 and 12A, the substrate holder 464 is preferably positioned above the cathode contact ring 466 and comprises a bladder assembly 470 that provides pressure to the backside of a substrate and ensures electric contact between the substrate plating surface and the cathode contact ring 466. The inflatable bladder assembly 470 is disposed on a substrate holder plate 832. A bladder 836 disposed on a lower surface of the substrate holder plate 832 is thus located opposite and adjacent to the contacts on the cathode contact ring 466 with the substrate 821 interposed there between. A fluid source 838 supplies a fluid, i.e., a gas or liquid, to the bladder 836 allowing the bladder 836 to be inflated to varying degrees.

Referring now to FIGS. 12, 12A, and 13, the details of the bladder assembly 470 will be discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849, commonly known as a venturi. One vacuum ejector that may be used to advantage is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The arrows indicate the desired direction of the fluid flow.

Where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
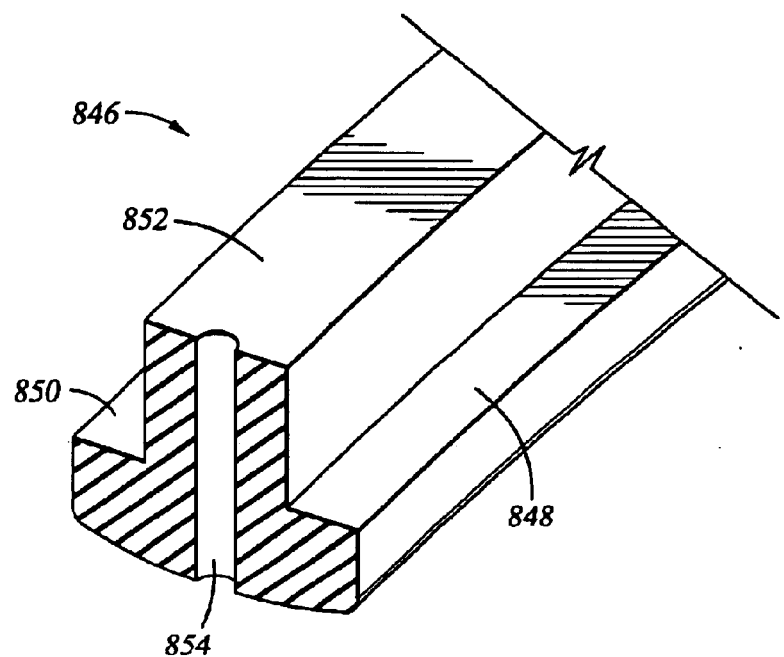
FIG. 14 is a partial cross sectional view of one embodiment of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners, not shown, such as screws may be used to secure the manifold 846 to the substrate holder plate 832 via cooperating threaded bores, not shown, formed in the manifold 846 and the substrate holder plate 832.

Figure 15:
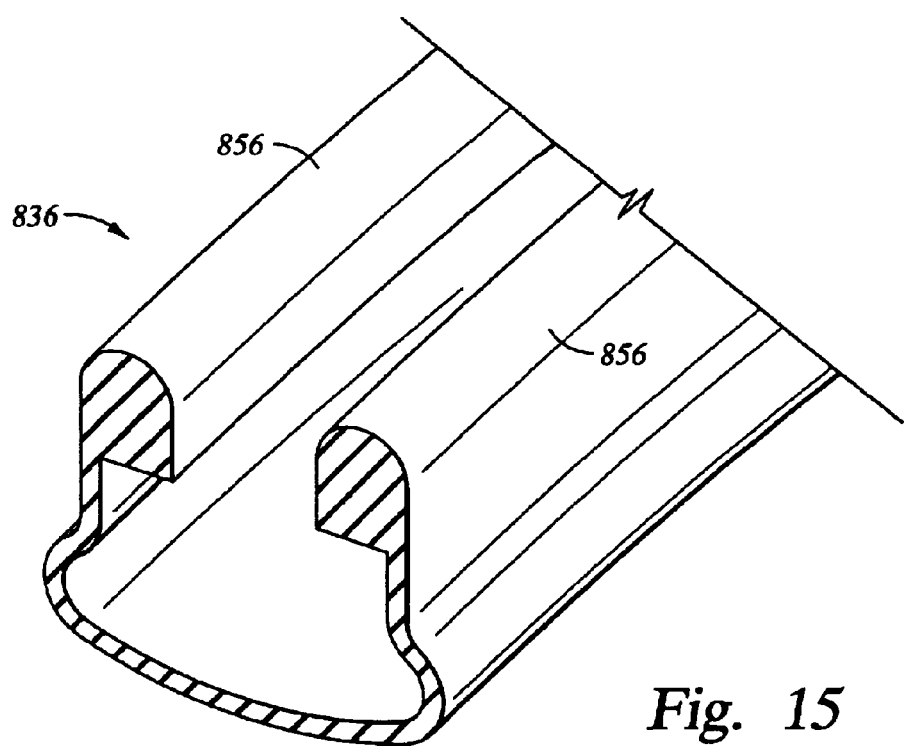
FIG. 15 is a partial cross sectional view of one embodiment of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846. The manifold has a width slightly less, e.g. a few millimeters, than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte solution and exhibits reliable elasticity. Where needed a compliant covering 857 may be disposed over the bladder 836, as shown in FIG. 15, and secured by means of an adhesive or thermal bonding. The covering 857 preferably comprises an elastomer such as VITON®, buna rubber or the like, which may be reinforced by KEVLAR® (a registered trademark of the E. I. duPont de Nemoirs and Company of Wilmington, Del.), for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836, if uncovered, and the exposed surface of the covering 857 are coated or treated to provide a hydrophilic surface, as discussed above for the surfaces of the cathode contact ring. This coating promotes dripping and removal of the residual electrolyte solution after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet that supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the cathode contact ring 466. The electroplating process is then carried out. Electrolyte solution is then pumped into the process cell 420 toward the substrate 821 to contact the exposed substrate plating surface 820. The power supply provides a negative bias to the substrate plating surface 820 via the cathode contact ring 466. As the electrolyte solution is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the cathode contact ring 466 thereby mitigating misalignment with the conducting cathode contact ring 466. The compliant bladder 836 prevents the electrolyte solution from contaminating the backside of the substrate 821 by establishing a fluid tight seal at a perimeter portion of a backside of the substrate 821. Once inflated, a uniform pressure is delivered downward toward the cathode contact ring 466 to achieve substantially equal force at all points where the substrate 821 and cathode contact ring 466 interface. The force can be varied as a function of the pressure supplied by the fluid source 838. Further, the effectiveness of the bladder assembly 470 is not dependent on the configuration of the cathode contact ring 466. For example, while FIG. 12 shows a pin configuration having a plurality of discrete contact points, the cathode contact ring 466 may also be a continuous surface.

Because the force delivered to the substrate 821 by the bladder 836 is variable, adjustments can be made to the current flow supplied by the contact ring 466. As described above, an oxide layer may form on the cathode contact ring 466 and act to restrict current flow. However, increasing the pressure of the bladder 836 may counteract the current flow restriction due to oxidation. As the pressure is increased, the malleable oxide layer is compromised and superior contact between the cathode contact ring 466 and the substrate 821 results. The effectiveness of the bladder 836 in this capacity may be further improved by altering the geometry of the cathode contact ring 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an OFF position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may be desirable to provide a backside pressure to the substrate 820 in order to cause a "bowing" effect of the substrate to be processed. Bowing, curving, the substrate may result in a desired deposition profile across the substrate. Thus, pumping system 859 is capable of selectively providing a vacuum or pressure condition to the substrate backside. For a 200 mm substrate a backside pressure up to 5 psi is preferable to bow the substrate. Because substrates typically exhibit some measure of pliability, a backside pressure causes the substrate to bow or assume a convex shape relative to the upward flow of the electrolyte solution. The degree of bowing is variable according to the pressure supplied by pumping system 859.

FIG. 12A shows a preferred bladder 836 having a surface area sufficient to cover a relatively small perimeter portion of the substrate backside at a diameter substantially equal to the cathode contact ring 466. The geometric configuration of the bladder assembly 470 can be varied. Thus, the bladder assembly may be constructed using more fluid impervious material to cover an increased surface area of the substrate 821.

Figure 19:
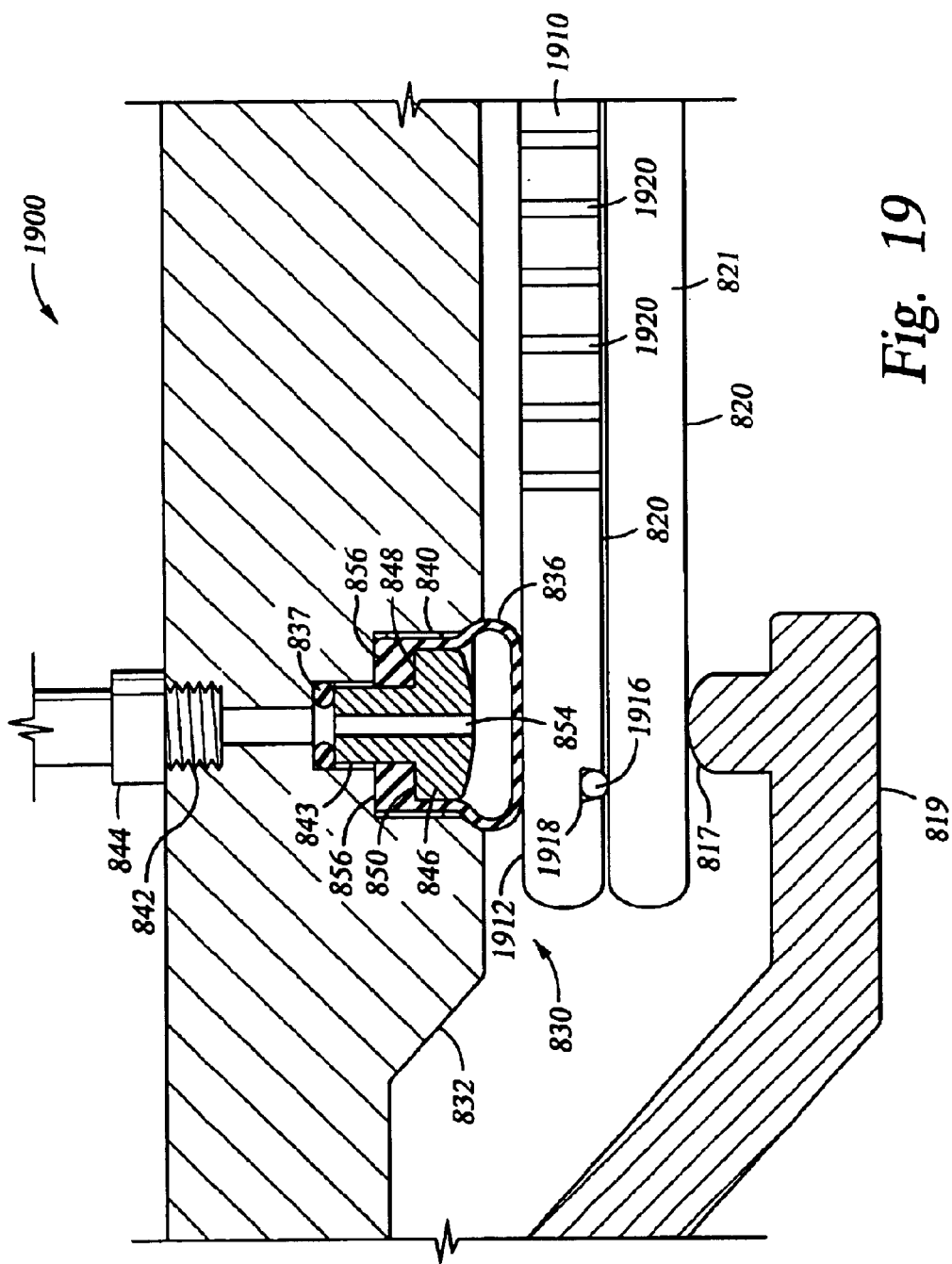
FIG. 19 is a partial cross sectional view of an alternative embodiment of a substrate holder assembly.

FIG. 19 is a partial cross sectional view of an alternative embodiment of a substrate holder assembly. The alternative substrate holder assembly 1900 comprises a bladder assembly 470, as described above, having the inflatable bladder 836 attached to the back surface of an intermediary substrate holder plate 1910. Preferably, a portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate 821 to be processed. An elastomeric o-ring 1916 is disposed in an annular groove 1918 on the front surface 1914 of the intermediary substrate holder plate 1910 to contact a peripheral portion of the substrate back surface. The elastomeric o-ring 1916 provides a seal between the substrate back surface and the front surface of the intermediary substrate holder plate. Preferably, the intermediary substrate holder plate includes a plurality of bores or holes 1920 extending through the plate that are in fluid communication with the vacuum port 841. The plurality of holds 1920 facilitate securing the substrate on the substrate holder using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 is preferably coated or treated to provide a hydrophilic surface, as discussed above for the surfaces of the cathode contact ring, for contacting the substrate. The elastomeric O-ring 1916 is replaced as needed to ensure proper contact and seal to the substrate.

Figure 25:
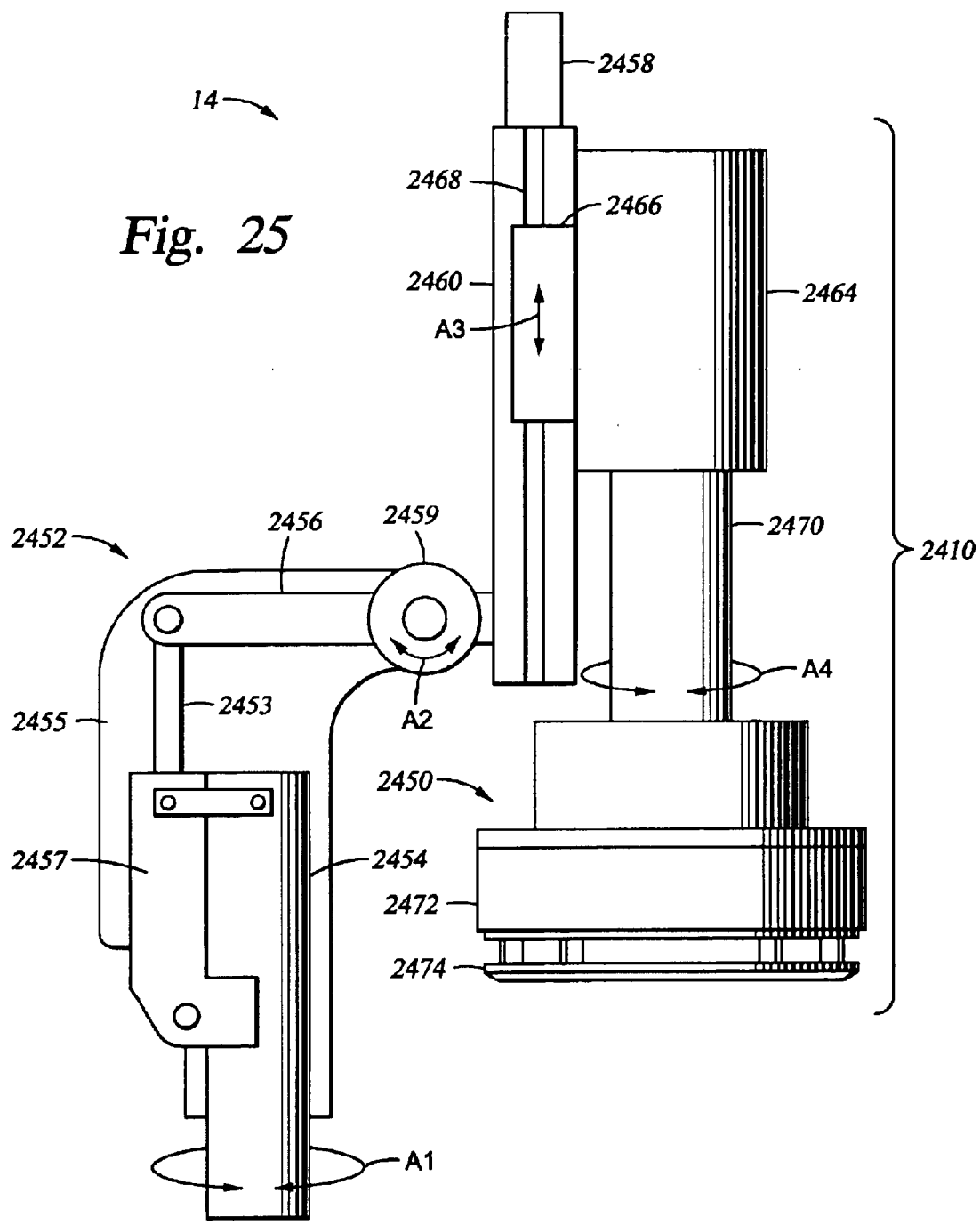
FIG. 25 is an alternative embodiment of the process head assembly having a rotatable head assembly 2410.

FIG. 25 is an alternative embodiment of the process head assembly having a rotatable head assembly 2410. Preferably, a rotational actuator is disposed on the cantilevered arm and attached to the head assembly to rotate the head assembly during substrate processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. Preferably, the mounting post 454 provides rotational movement, as indicated by arrow Al, with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement, as indicated by arrow A2, of the cantilever arm 2456 with respect to the joint 2459 between the cantilever arm 2456 and the post cover 2454. When the cantilever arm actuator 2457 is retracted, the cantilever arm 2456 moves the head assembly 2410 away from the process cell 420. The movement of the head assembly 2410 provides the spacing required to remove and/or replace the process cell 420 from the electroplating process cell 240. When the cantilever arm actuator 2457 is extended, the cantilever arm 2456 moves the head assembly 2410 toward the process cell 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that moves the lift guide, as indicated by arrows A3, between various vertical positions. The rotating actuator 2464 is connected to the substrate holder assembly 2450 through the shaft 2470 and rotates the substrate holder assembly 2450, as indicated by arrows A4. The substrate holder assembly 2450 includes a bladder assembly, such as the embodiments described above with respect to FIGS. 12-15 and 19, and a cathode contact ring, such as the embodiments described above with respect to FIGS. 7-10 and 18.

The rotation of the substrate during the electroplating process generally enhances the deposition results. Preferably, the head assembly is rotated between about 2 rpm and about 20 rpm during the electroplating process. The head assembly can also be rotated. The head assembly can be lowered to position the seed layer on the substrate in contact with the electrolyte solution in the process cell. The head assembly is raised to remove the seed layer on the substrate from the electrolyte solution in the process cell. The head assembly is preferably rotated at a high speed, i.e., >20 rpm, after the head assembly is lifted from the process cell to enhance removal of residual electrolyte solution on the head assembly.

In one embodiment, the uniformity of the deposited film has been improved within about 2%, i.e., maximum deviation of deposited film thickness is at about 2% of the average film thickness, while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the chemicals in the electrolyte solution, electrolyte solution flow and other parameters.

Referring back to FIG. 6, a cross sectional view of an electroplating process cell 400, the substrate holder assembly 450 is positioned above the process cell 420. The process cell 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, PLEXIGLAS® (acrylic), lexane, PVC, CPVC, and PVDF. Alternatively, the container body 472 can be made from a coated metal, such as stainless steel, nickel and titanium. The coated metal is coated with an insulating layer, such as TEFLON® (a trademark of E. I. du Pont de Nemours and Company of Wilmington, Del.), PVDF, plastic, rubber and other combinations of materials, that do not dissolve in the electrolyte solution. The insulating layer can be electrically insulated from the electrodes, i.e., the anode and cathode of the electroplating system. The container body 472 is preferably sized and adapted to conform to the substrate plating surface and the shape of a substrate being processed through the system, typically circular or rectangular in shape. One preferred embodiment of the container body 472 comprises a cylindrical ceramic tube having an inner diameter that has about the same dimension as or slightly larger than the substrate diameter. The inventors have discovered that the rotational movement typically required in typical electroplating systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte solution collector 440 and allows the electrolyte solution to flow into the electrolyte solution collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472. A gap for electrolyte solution flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte solution into the electrolyte solution collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte solution collector 440. The smaller dimension of the annular flange allows removal and replacement of the process cell 420 from the electroplating process cell 400. Preferably, multiple bolts 488 are fixedly disposed on the annular flange 486 and extend downwardly through matching bolt holes on the bowl 430. A plurality of removable fastener nuts 490 secure the process cell 420 onto the bowl 430. A seal 487, such as an elastomer O-ring, is disposed between container body 472 and the bowl 430 radially inwardly from the bolts 488 to prevent leaks from the process cell 420. The nuts/bolts combination facilitates fast and easy removal and replacement of the components of the process cell 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte solution. Alternatively, the anode assembly 474 comprises a non-consumable anode, and the metal to be electroplated is supplied within the electrolyte solution from the electrolyte solution replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electrochemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte solution and minimizes the need to constantly replenish the metal in the electrolyte solution.

An anode electrode contact 498 is inserted through the anode enclosure 494 to provide electric connection to the soluble metal 496 from a power supply. Preferably, the anode electrode contact 498 is made from a conductive material that is insoluble in the electrolyte solution, such as titanium, platinum and platinum-coated stainless steel. The anode electrode contact 498 extends through the bowl 430 and is connected to an electric power supply. Preferably, the anode electric contact 498 includes a threaded portion 497, for a fastener nut 499 to secure the anode electric contact 498 to the bowl 430, and a seal 495 such as a elastomer washer, is disposed between the fastener nut 499 and the bowl 430 to prevent leaks from the process cell 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. Bolts 488 are inserted through the holes 508, and the fastener nuts 490 are fastened onto the bolts 488 that secure the upper annular flange 506 of the bowl 430 to the lower annular flange 486 of the container body 472. Preferably, the outer dimension, i.e., circumference, of the upper annular flange 506 is about the same as the outer dimension, i.e., circumference, of the lower annular flange 486. Preferably, the lower surface of the upper annular flange 506 of the bowl 430 rests on a support flange of the mainframe 214 when the process cell 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502. These relative dimensions force a substantial portion of the electrolyte solution to flow through the anode assembly 474 first before flowing through the filter 476. The bottom portion 504 of the bowl 430 includes an electrolyte solution inlet 510 that connects to an electrolyte solution supply line from the electrolyte solution replenishing system 220. Preferably, the anode assembly 474 is disposed about a middle portion of the cylindrical portion 502 of the bowl 430. The anode assembly 474 is configured to provide a gap for electrolyte solution flow between the anode assembly 474 and the electrolyte solution inlet 510 on the bottom portion 504.

A releasable connector preferably connects the electrolyte solution inlet 510 and the electrolyte solution supply line. The releasable connector facilitates easy removal and replacement of the process cell 420. When the process cell 420 needs maintenance, the electrolyte solution is drained from the process cell 420, and the electrolyte solution flow in the electrolyte solution supply line is discontinued and drained. The connector for the electrolyte solution supply line is released from the electrolyte solution inlet 510, and the electric connection to the anode assembly 474 is also disconnected. The head assembly 410 is raised or rotated to provide clearance for removal of the process cell 420. The process cell 420 is then removed from the mainframe 214, and a new or reconditioned process cell is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
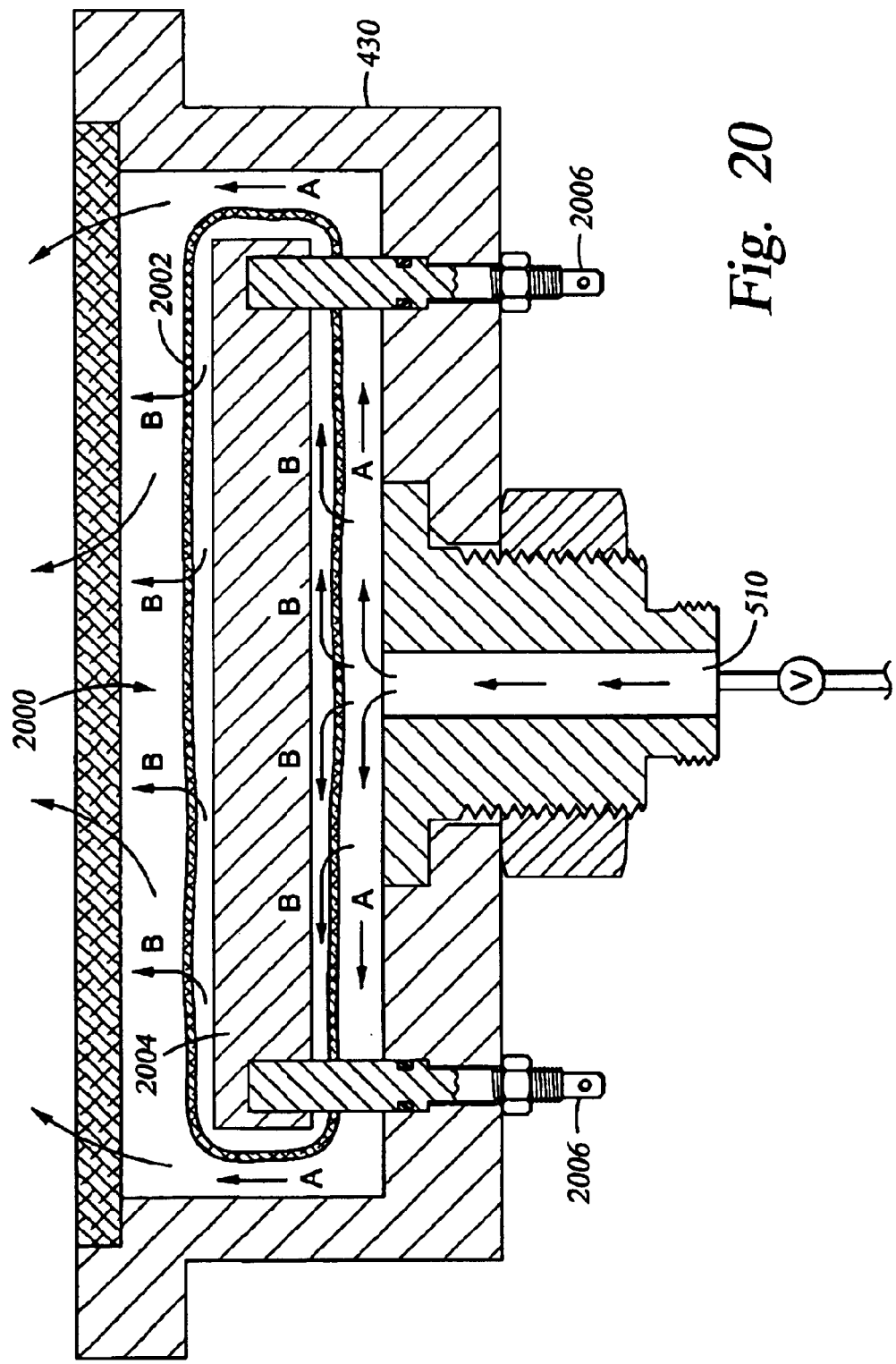
FIG. 20 is a cross sectional view of an embodiment of an encapsulated anode.

FIG. 20 is a cross sectional view of one embodiment of an encapsulated anode. The encapsulated anode 2000 includes a permeable anode enclosure that filters or traps "anode sludge" or particulates generated as the metal is dissolved from the anode plate 2004. As shown in FIG. 20, the anode plate 2004 comprises a solid piece of copper. Preferably, the anode plate 2004 is a high purity, oxygen free copper, enclosed in a hydrophilic anode encapsulation membrane 2002. The anode plate 2004 is secured and supported by a plurality of electric contacts or feed-throughs 2006 that extend through the bottom of the bowl 430. The electric contacts or feed-throughs 2006 extend through the anode encapsulation membrane 2002 into the bottom surface of the anode plate 2004. The flow of the electrolyte solution is indicated by the arrows A from the electrolyte solution inlet 510 disposed at the bottom of the bowl 430 through the gap between the anode and the bowl sidewall. The electrolyte solution also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 $\mu$m and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford. Mass. As the electrolyte solution flows through the encapsulation membrane, anode sludge and particulates generated by the dissolving anode are filtered or trapped by the encapsulation membrane. Thus, the encapsulation membranes improve the purity of the electrolyte solution during the electroplating process, and defect formations on the substrate during the electroplating process caused by anode sludge and contaminant particulates are significantly reduced.

Figure 21:
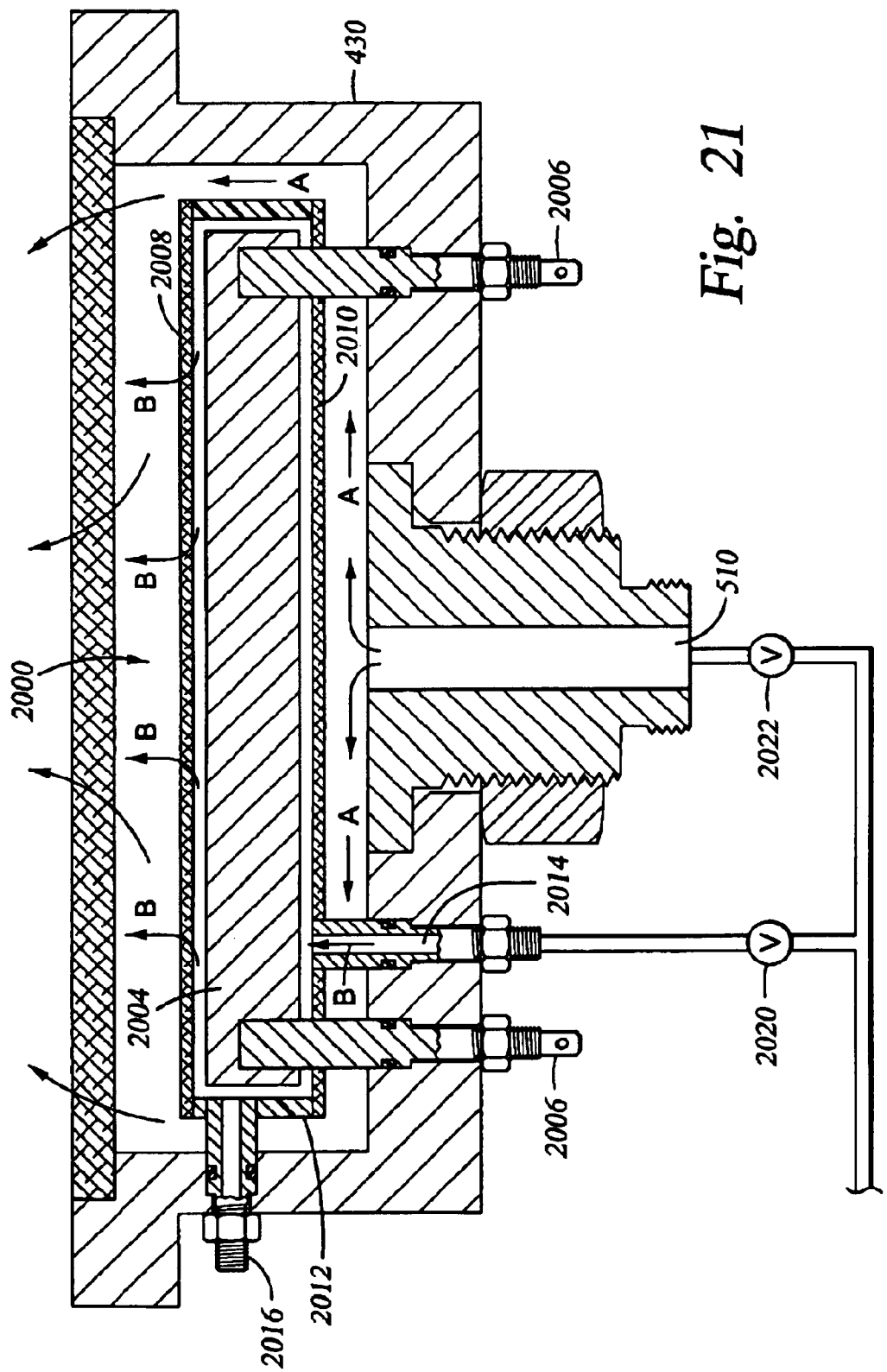
FIG. 21 is a cross sectional view of another embodiment of an encapsulated anode.

FIG. 21 is a cross sectional view of another embodiment of an encapsulated anode. Similar to the first embodiment of an encapsulated anode, the anode plate 2004 is secured and supported on the electric feed-throughs 2006. A top encapsulation membrane 2008 and a bottom encapsulation membrane 2010 are disposed respectively above and below the anode plate 2004, are attached to a membrane support ring 2012 that is disposed around the anode plate 2004. The top and bottom encapsulation membranes 2008, 2010 comprise a material from the list above for encapsulation membrane of the first embodiment of the encapsulated anode. The membrane support ring 2012 preferably comprises a relatively rigid material, as compared to the encapsulation membrane, such as plastic or other polymers. A bypass fluid inlet 2014 is disposed through the bottom of the bowl 430 and through the bottom encapsulation membrane 2010 to introduce electrolyte solution into the gap between the encapsulation membranes and the anode plate. A bypass outlet 2016 is connected to the membrane support ring 2012 and extends through the bowl 430 to facilitate flow of excess electrolyte solution with the anode sludge or generated particulates out of the encapsulated anode into a waste drain, not shown.

Preferably, the flow of the electrolyte solution within the bypass fluid inlet 2014 and the main electrolyte solution inlet 510 are individually controlled by flow control valves 2020, 2022. The individual flow control valves 2020, 2022 are respectively placed along the fluid lines connected to the inlets. The fluid pressure in the bypass fluid inlet 2014 is preferably maintained at a higher pressure than the pressure in the main electrolyte solution inlet 510. The flow of the electrolyte solution inside the bowl 430 from the main electrolyte solution inlet 510 is indicated by arrows A, and the flow of the electrolyte solution inside the encapsulated anode 2000 is indicated by the arrows B. A portion of the electrolyte solution introduced into the encapsulated anode flows out of the encapsulated anode through the bypass outlet 2016. By providing a dedicated bypass electrolyte solution supply into the encapsulated anode, the anode sludge or particulates generated from the dissolving anode is continually removed from the anode, thereby improving the purity of the electrolyte solution during the electroplating process.

Figure 22:
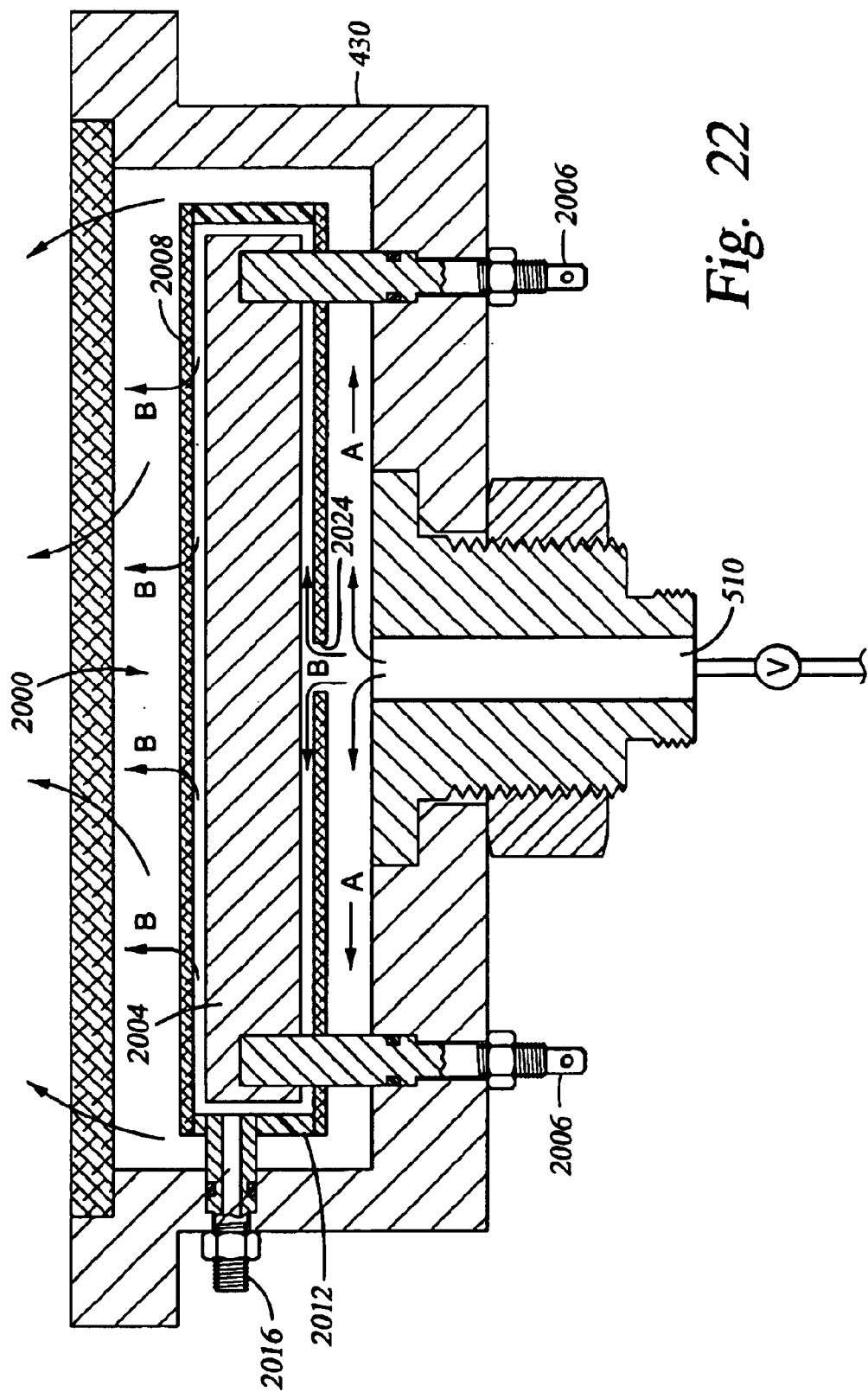
FIG. 22 is a cross sectional view of another embodiment of an encapsulated anode.

FIG. 22 is a cross sectional view of a third embodiment of an encapsulated anode. This embodiment of an encapsulated anode 2000 includes an anode plate 2002, a top encapsulation membrane 2006, a bottom encapsulation membrane 2010, and a membrane support ring 2012. The anode plate 2002 is secured and supported on a plurality of electric feed-throughs 2006. A top and a bottom encapsulation membrane 2008, 2010 are attached to a membrane support ring 2012. A bypass fluid inlet 2014 is disposed through the bottom of the bowl 430 and through the bottom encapsulation membrane 2010 to introduce electrolyte solution into the gap between the encapsulation membranes and the anode plate. This third embodiment of an encapsulated anode preferably comprises materials as described above for the first and second embodiments of an encapsulated anode. The bottom encapsulation membrane 2010 according to the third embodiment includes one or more openings 2024 disposed substantially above the main electrolyte solution inlet 510. The opening 2024 is adapted to receive flow of electrolyte solution from the main electrolyte solution inlet 510 and is preferably about the same size as the internal circumference of the main electrolyte solution inlet 510. The flow of the electrolyte solution from the main electrolyte solution inlet 510 is indicated by the arrows A and the flow of the electrolyte solution within the encapsulated anode is indicated by the arrows B. A portion of the electrolyte solution flows out of the encapsulated anode through the bypass outlet 2016, carrying a portion of the anode sludge and particulates generated from anode dissolution.

Figure 23:
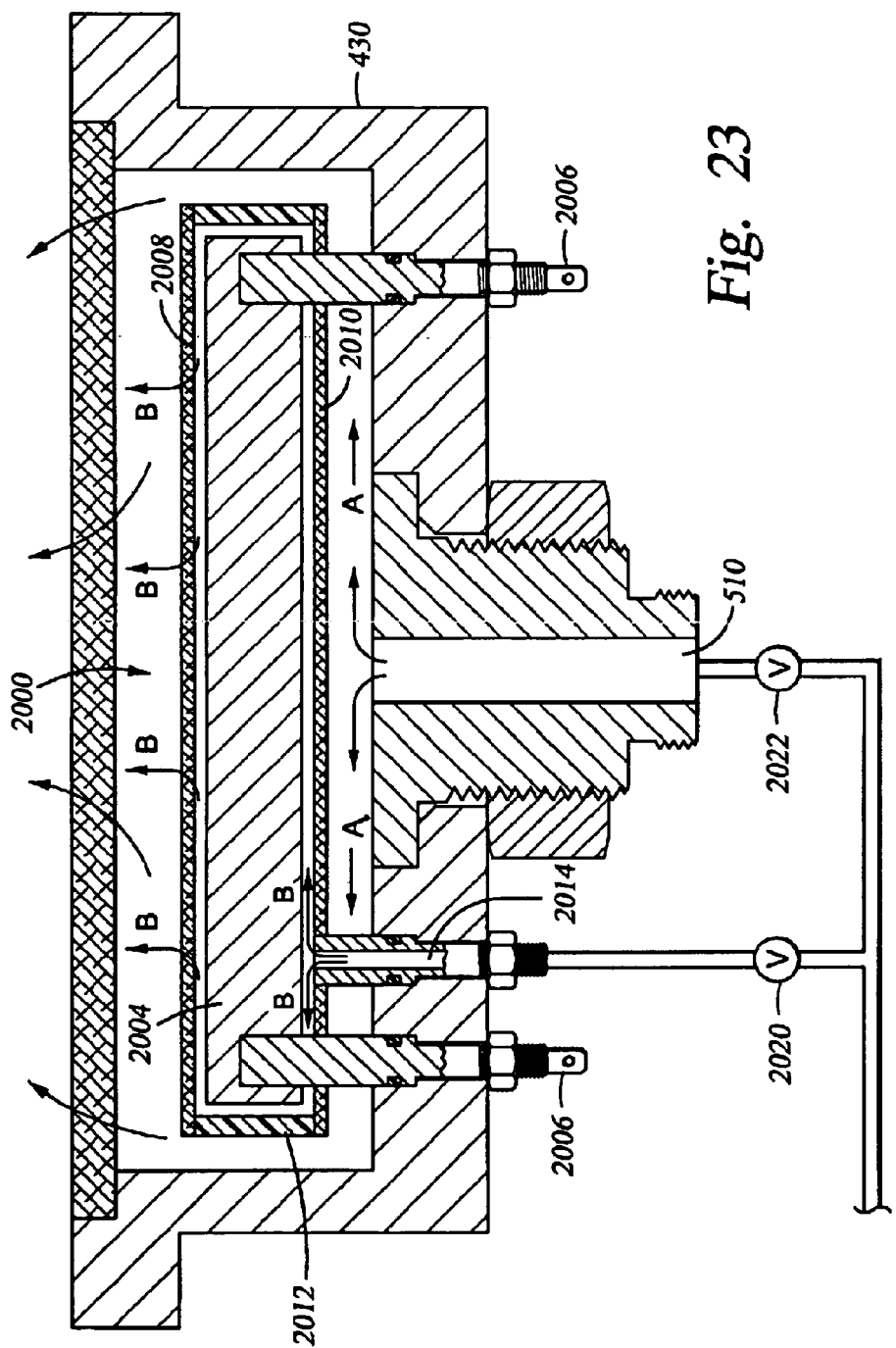
FIG. 23 is a cross sectional view of yet another embodiment of an encapsulated anode.

FIG. 23 is a cross sectional view of yet another embodiment of an encapsulated anode. This embodiment of an encapsulated anode 2000 includes an anode plate 2002, a top encapsulation membrane 2006, a bottom encapsulation membrane 2010, and a membrane support ring 2012. The anode plate 2002 is secured and supported on a plurality of electric feed-throughs 2006. A top and a bottom encapsulation membrane 2008, 2010 are attached to a membrane support ring 2012. A bypass fluid inlet 2014 is disposed through the bottom of the bowl 430 and through the bottom encapsulation membrane 2010 to introduce electrolyte solution into the gap between the encapsulation membranes and the anode plate. This embodiment of an encapsulated anode preferably comprises materials as described above for the first and second embodiments of an encapsulated anode. Preferably, the flow of the electrolyte solution through the bypass fluid inlet 2014 and the main electrolyte solution inlet 510 are individually controlled by control valves 2020, 2022, respectively. The flow of the electrolyte solution from the main electrolyte solution inlet 510 is indicated by the arrow A. The flow of the electrolyte solution through the encapsulated anode is indicated by arrow B. For this embodiment, the anode sludge and particulates generated by the dissolving anode plate are filtered and trapped by the encapsulation membranes as the electrolyte solution passes through the membrane.

Figure 16:
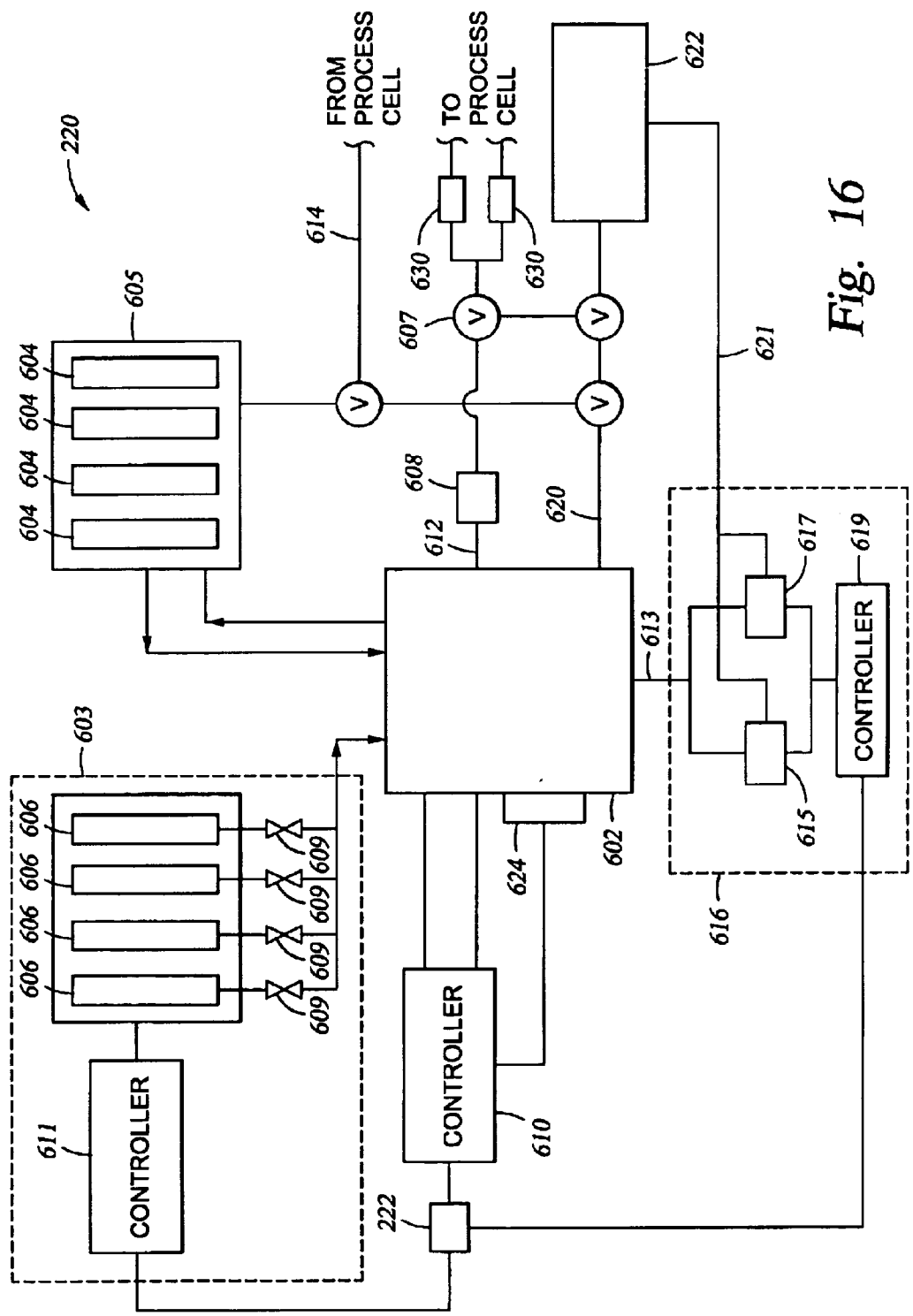
FIG. 16 is a schematic diagram of one embodiment of an electrolyte solution system.

FIG. 16 is a schematic diagram of an electrolyte solution replenishing system 220. The electrolyte solution replenishing system 220 provides the electrolyte solution to the electroplating process cells for the electroplating process. The electrolyte solution replenishing system 220 generally comprises a main electrolyte solution tank 602, a dosing module 603, a filtration module 605, a chemical analyzer module 616, and an electrolyte solution waste disposal system 622 connected to the analyzing module 616 by an electrolyte solution waste drain 620. One or more controllers control the composition of the electrolyte solution in the main tank 602 and the operation of the electrolyte solution replenishing system 220. Preferably, the controllers are independently operable but integrated with the controller 222 of the electroplating system platform 200.

The main electrolyte solution tank 602 provides a reservoir for electrolyte solution and includes an electrolyte solution supply line 612 that is connected to each of the electroplating process cells through one or more fluid pumps 608 and valves 607. A heat exchanger 624 or a heater/chiller disposed in thermal connection with the main tank 602 controls the temperature of the electrolyte solution stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte solution and typically include a deionized water source tank and copper sulfate ($CuSO_4$) source tank for composing the electrolyte solution. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the controller 222 to receive signals therefrom.

The electrolyte solution filtration module 605 includes a plurality of filter tanks 604. An electrolyte solution return line 614 is connected between each of the process cells and one or more filter tanks 604. The filter tanks 604 remove the undesired contents in the used electrolyte solution before returning the electrolyte solution to the main tank 602 for re-use. The main tank 602 is also connected to the filter tanks 604 to facilitate re-circulation and filtration of the electrolyte solution in the main tank 602. By re-circulating the electrolyte solution from the main tank 602 through the filter tanks 604, the undesired contents in the electrolyte solution are continuously removed by the filter tanks 604 to maintain a consistent level of purity. Additionally, re-circulating the electrolyte solution between the main tank 602 and the filtration module 605 allows the various chemicals in the electrolyte solution to be thoroughly mixed.

The electrolyte solution replenishing system 220 also includes a chemical analyzer module 616 that provides real-time chemical analysis of the chemical composition of the electrolyte solution. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte solution. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer that may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives that may be used in the electrolyte solution and by-products resulting from the processing which are returned to the main tank 602 from the process cells.

The analyzer module shown FIG. 16 is merely illustrative. In another embodiment each analyzer may be coupled to the main electrolyte solution tank by a separate supply line and be operated by separate controllers. Persons skilled in the art will recognize other embodiments.

In operation, a sample of electrolyte solution is flowed to the analyzer module 616 via the sample line 613. Although the sample may be taken periodically, preferably a continuous flow of electrolyte solution is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the controller 222. The controller 222 processes the information and transmits signals that include user-defined chemical dosage parameters to the dosing controller 611. The received information is used to provide real-time adjustments to the source chemical replenishment rates by operating one or more of the valves 609. The received information thereby maintains a desired, and preferably constant, chemical composition of the electrolyte solution throughout the electroplating process. The waste electrolyte solution from the analyzer module is then flowed to the waste disposal system 622 via the outlet line 621.

Although a preferred embodiment utilizes real-time monitoring and adjustments of the electrolyte solution, various alternatives may be employed. For example, the dosing module 603 may be controlled manually by an operator observing the output values provided by the chemical analyzer module 616. Preferably, the system software allows for both an automatic real-time adjustment mode as well as an operator, manual, mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte solution replenishing system 220 also includes an electrolyte solution waste drain 620 connected to an electrolyte solution waste disposal system 622 for safe disposal of used electrolyte solutions, chemicals and other fluids used in the electroplating system. Preferably, the electroplating cells include a direct line connection to the electrolyte solution waste drain 620, or the electrolyte solution waste disposal system 622. The electrolyte solution waste drain 620 drains the electroplating cells without returning the electrolyte solution through the electrolyte solution replenishing system 220. The electrolyte solution replenishing system 220 preferably also includes a bleed off connection to bleed off excess electrolyte solution to the electrolyte solution waste drain 620.

Preferably, the electrolyte solution replenishing system 220 also includes one or more degasser modules 630 adapted to remove undesirable gases from the electrolyte solution. The degasser module generally comprises a membrane that separates gases from the fluid passing through the degasser module and a vacuum system for removing the released gases. The degasser modules 630 are preferably placed in line on the electrolyte solution supply line 612 adjacent to the process cells 240. The degasser modules 630 are preferably positioned as close as possible to the process cells 240 so most of the gases from the electrolyte solution replenishing system are removed by the degasser modules before the electrolyte solution enters the process cells. Preferably, each degasser module 630 includes two outlets to supply degassed electrolyte solution to the two process cells 240 of each processing station 218. Alternatively, a degasser module 630 is provided for each process cell. The degasser modules can be placed at many other alternative positions. For example, the degasser module can be placed at other positions in the electrolyte solution replenishing system, such as along with the filter section or in a closed-loop system with the main tank or with the processing cell. As another example, one degasser module is placed in line with the electrolyte solution supply line 612 to provide degassed electrolyte solution to all of the process cells 240 of the electro-chemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
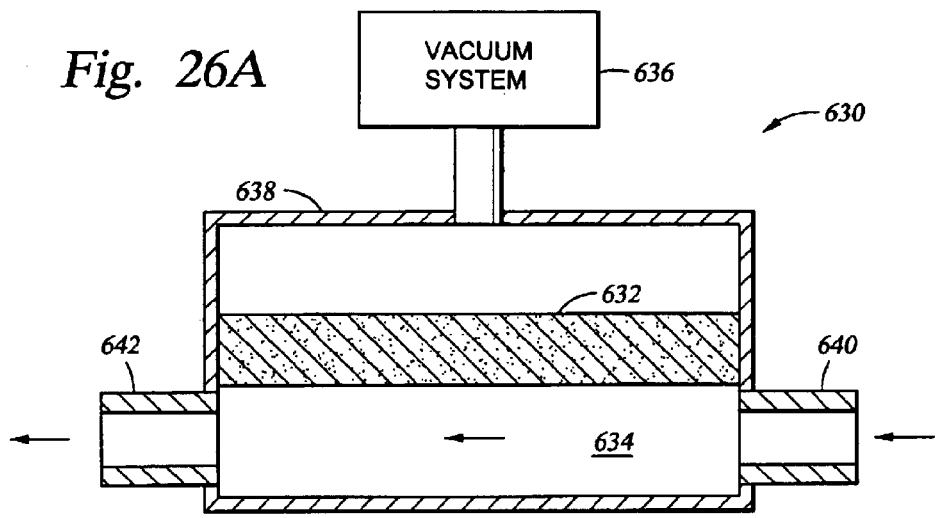
FIGS. 26a and 26b are cross sectional views of one embodiment of of a degasser module.
Figure 26B:
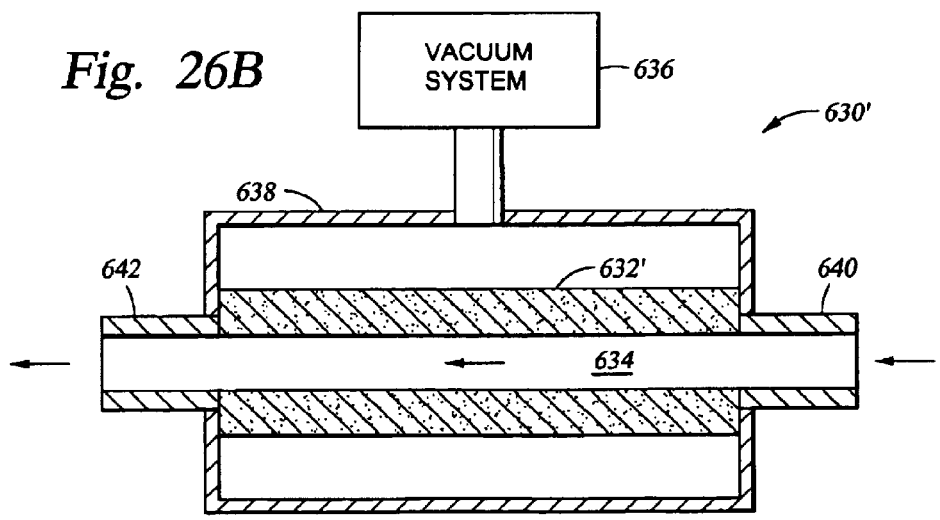

One embodiment of the degasser module 630, as shown in FIG. 26a, includes a hydrophobic membrane 632 having a fluid, i.e., electrolyte solution, passage 634 on one side of the membrane 632. A vacuum system 636 disposed on the opposite side of the membrane. The enclosure 638 of the degasser module includes an inlet 640 and one or more outlets 642. As the electrolyte solution passes through the degasser module 630, the gases and other micro-bubbles in the electrolyte solution are separated from the electrolyte solution through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte solution is introduced inside the tube of hydrophobic membrane, and as the electrolyte solution passes through the fluid passage 634 in the tube. The hydrophobic membrane separates gases and other micro-bubbles in the electrolyte solution, and a tube that is connected to the vacuum system 636 removes the separated gasses. More complex designs of degasser modules are contemplated, including designs having serpentine paths of the electrolyte solution across the membrane and other multi-sectioned designs of degasser modules.

Although not shown in FIG. 16, the electrolyte solution replenishing system 220 may include a number of other components. For example, the electrolyte solution replenishing system 220 preferably also includes one or more additional tanks for storage of chemicals for a substrate cleaning system, such as the SRD station. Double-contained piping for hazardous material connections may also be employed to provide safe transport of the chemicals throughout the system. Optionally, the electrolyte solution replenishing system 220 includes connections to additional or external electrolyte solution processing system to provide additional electrolyte solution supplies to the electroplating system.

Figure 17:
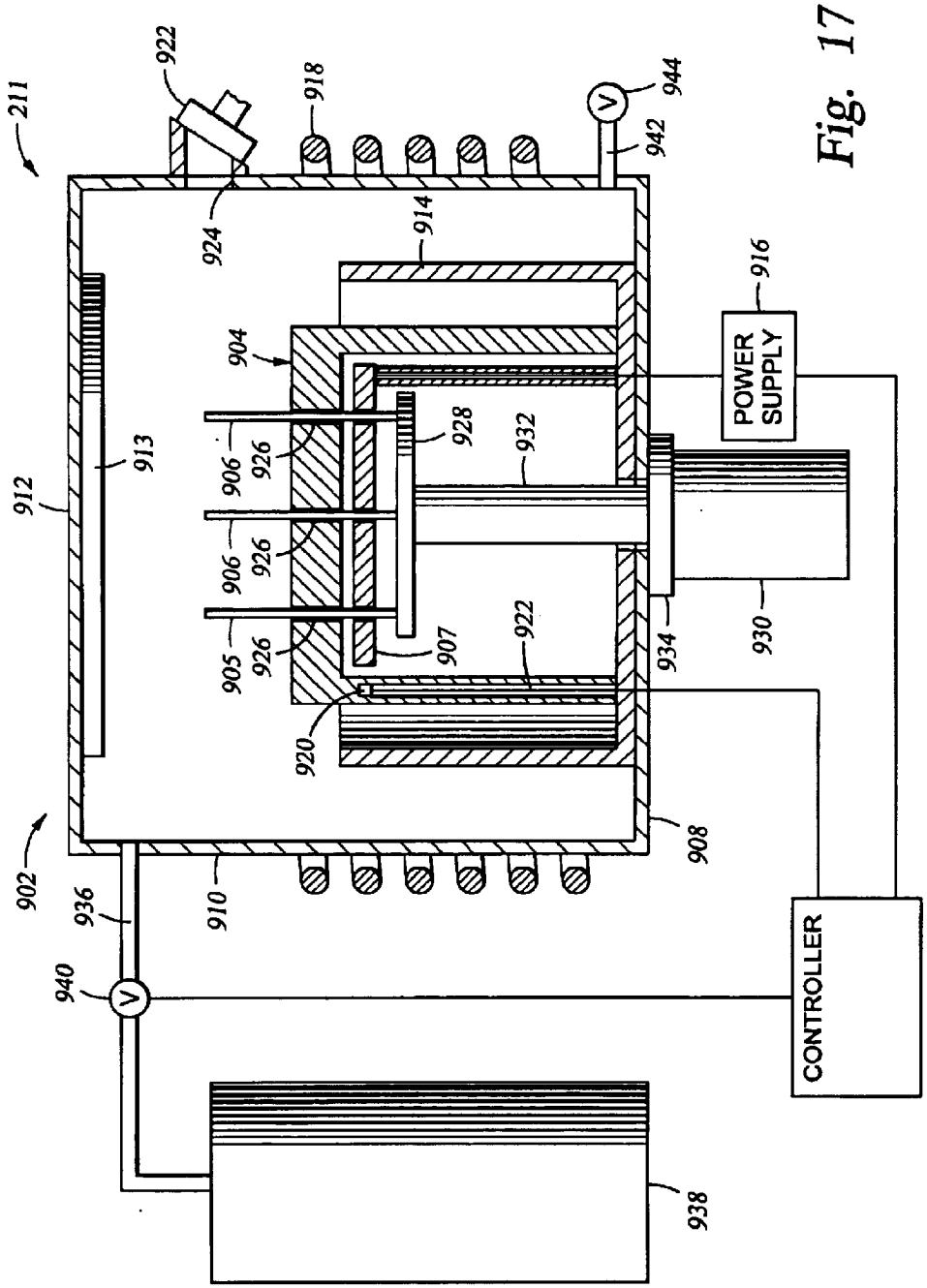
FIG. 17 is a cross sectional view of one embodiment of a rapid thermal anneal chamber.

FIG. 17 is a cross sectional view of one embodiment of rapid thermal anneal (RTA) chamber. The RTA chamber 211 is preferably connected to the loading station 210, and substrates are transferred into and out of the RTA chamber 211 by the loading station transfer robot 228. The electroplating system, as shown in FIGS. 2 and 3, preferably comprises two RTA chambers 211 disposed on opposing sides of the loading station 210, corresponding to the symmetric design of the loading station 210. RTA chambers are generally well known in the art, and RTA chambers are typically utilized in substrate processing systems to enhance the properties of the deposited materials. A variety of RTA chamber designs are contemplated, including hot plate designs and heat lamp designs, to enhance the electroplating results. One particular useful RTA chamber is the WxZ chamber available from Applied materials, Inc., located in Santa Clara, Calif. Although a hot plate RTA chamber is described, other RTA chambers may be used as well.

The RTA chamber 211 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the 912 of the enclosure. Preferably, a reflector insulator dish 914 is disposed inside the enclosure 902 on the base 908. The reflector insulator dish 914 is typically made from a material such as quartz, alumina, or other material that can withstand high temperatures, i.e., greater than about 500° C. The reflector insulator dish acts as a thermal insulator between the heater 907 and the enclosure 902. The dish 914 may also be coated with a reflective material, such as gold, to direct heat back to the heater plate 904.

The heater plate 904 preferably has a large mass compared to the substrate being processed in the system. The heater plate is preferably fabricated from a material such as silicon carbide, quartz, or other materials that do not react with any ambient gases in the RTA chamber 211 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller i.e., the system controller described below and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels, not shown, are formed within the sidewall 910 to control the temperature of the enclosure 902. The cold plate 913 disposed on the inside surface of the top 912 cools a substrate that is positioned in close proximity to the cold plate 913.

The RTA chamber 211 includes a slit valve 922 disposed on the sidewall 910 of the enclosure 902 for facilitating transfers of substrates into and out of the RTA chamber. The slit valve 922 selectively seals an opening 924 on the sidewall 910 of the enclosure that communicates with the loading station 210. The loading station transfer robot 228, see FIG. 2, transfers substrates into and out of the RTA chamber through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an actuator 930, such as a stepper motor, through a lift shaft 932. The actuator 930 moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 211, the slit valve 922 is opened, and the loading station transfer robot 228 extends its robot blade having a substrate positioned thereon through the opening 924 into the RTA chamber. The robot blade of the loading station transfer robot 228 positions the substrate in the RTA chamber above the heater plate 904, and the substrate support pins 906 are extended upwards to lift the substrate above the robot blade. The robot blade then retracts out of the RTA chamber, and the slit valve 922 closes the opening. The substrate support pins 906 are then retracted to lower the substrate to a desired distance from the heater plate 904. Optionally, the substrate support pins 906 may retract flilly to place the substrate in direct contact with the heater plate.

Preferably, a gas inlet 936 is disposed through the sidewall 910 of the enclosure 902 to allow selected gas flow into the RTA chamber 211 during the anneal treatment process. The gas inlet 936 is connected to a gas source 938 through a valve 940 for controlling the flow of the gas into the RTA chamber 211. A gas outlet 942 is preferably disposed at a lower portion of the sidewall 910 of the enclosure 902 to exhaust the gases in the RTA chamber. The gas outlet is preferably connected to a relief/check valve 944 to prevent backstreaming of atmosphere from outside of the chamber. Optionally, the gas outlet 942 is connected to a vacuum pump (not shown) to exhaust the RTA chamber to a desired vacuum level during an anneal treatment A substrate is annealed in the RTA chamber 211 after the substrate has been electroplated in the electroplating cell and cleaned in the SRD station. Preferably, the RTA chamber 211 is maintained at about atmospheric pressure, and the oxygen content inside the RTA chamber 211 is controlled to less than about 100 ppm during the anneal treatment process. Preferably, the ambient environment inside the RTA chamber 211 comprises nitrogen ($N_2$) or a combination of nitrogen ($N_2$) and less than about 4% hydrogen ($H_2$) The ambient gas flow into the RTA chamber 211 is maintained at greater than 20 liters/min to control the oxygen content to less than 100 ppm. The electroplated substrate is preferably annealed at a temperature between about 200° C. and about 450° C. for between about 30 seconds and 30 minutes, and more preferably, between about 250° C. and about 400° C. for between about 1 minute and 5 minutes. RTA processing typically requires a temperature increase of at least 50° C. per second. To provide the required rate of temperature increase for the substrate during the anneal treatment, the heater plate is preferably maintained at between about 350° C. and 450° C. The substrate is preferably positioned at between about 0 mm and about 20 mm from the heater plate i.e., contacting the heater plate, for the duration of the anneal treatment process. Preferably, a controller 222 controls the operation of the RTA chamber 211, including maintaining the desired ambient environment in the RTA chamber and the temperature of the heater plate.

After the anneal treatment process is completed, the substrate support pins 906 lift the substrate to a position for transfer out of the RTA chamber 211. The slit valve 922 opens, and the robot blade of the loading station transfer robot 228 is extended into the RTA chamber and positioned below the substrate. The substrate support pins 906 retract to lower the substrate onto the robot blade, and the robot blade then retracts out of the RTA chamber. The loading station transfer robot 228 then transfers the processed substrate into the cassette 232 for removal out of the electroplating processing system. (see FIGS. 2 and 3).

Referring back to FIG. 2, the electroplating system platform 200 includes a controller 222 that controls the functions of each component of the platform. Preferably, the controller 222 is mounted above the mainframe 214, and the controller comprises a programmable microprocessor. The programmable microprocessor is typically programmed using a software designed specifically for controlling all components of the electroplating system platform 200. The controller 222 also provides electric power to the components of the system and includes a control panel 223 that allows an operator to monitor and operate the electroplating system platform 200. The control panel 223, as shown in FIG. 2, is a stand-alone module that is connected to the controller 222 through a cable and provides easy access to an operator. Generally, the controller 222 coordinates the operations of the loading station 210, the RTA chamber 211, the SRD station 212, the mainframe 214 and the processing stations 218. Additionally, the controller 222 coordinates with the controller of the electrolyte solution replenishing system 220 to provide the electrolyte solution for the electroplating process.

The following is a description of a typical substrate electroplating process sequence through the electroplating system platform 200 as shown in FIG. 2. A substrate cassette containing a plurality of substrates is loaded into the substrate cassette receiving areas 224 in the loading station 210 of the electroplating system platform 200. A loading station transfer robot 228 picks up a substrate from a substrate slot in the substrate cassette and places the substrate in the substrate orientor 230. The substrate orientor 230 determines and orients the substrate to a desired orientation for processing through the system. The. loading station transfer robot 228 then transfers the oriented substrate from the substrate orientor 230 and positions the substrate in one of the substrate slots in the substrate pass-through cassette 238 in the SRD station 212. The mainframe transfer robot 242 picks up the substrate from the substrate pass-through cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder 464 but above the cathode contact ring 466. The flipper robot 248 then releases the substrate to position the substrate into the cathode contact ring 466. The substrate holder 464 moves toward the substrate and the vacuum chuck secures the substrate on the substrate holder 464. The bladder assembly 470 on the substrate holder assembly 450 exerts pressure against the substrate backside to ensure electric contact between the substrate plating surface and the cathode contact ring 466.

The head assembly 452 is lowered to a processing position above the process cell 420. At this position the substrate is below the upper plane of the weir 478 and contacts the electrolyte solution contained in the process cell 420. The power supply is activated to supply electric power, i.e., voltage and current, to the cathode and the anode to enable the electroplating process. The electrolyte solution is typically continually pumped into the process cell during the electroplating process. The electric power supplied to the cathode and the anode and the flow of the electrolyte solution are controlled by the controller 222. Preferably, the head assembly is rotated as the head assembly is lowered and also during the electroplating process.

After the electroplating process is completed, the head assembly 410 raises the substrate holder assembly and removes the substrate from the electrolyte solution. Preferably, the head assembly is rotated for a period of time to enhance removal of residual electrolyte solution from the substrate holder assembly. The vacuum chuck and the bladder assembly of the substrate holder then release the substrate from the substrate holder. The substrate holder is raised to allow the flipper robot blade to pick up the processed substrate from the cathode contact ring. The flipper robot rotates the flipper robot blade above the backside of the processed substrate in the cathode contact ring and picks up the substrate using the vacuum suction gripper on the flipper robot blade. The flipper robot rotates the flipper robot blade with the substrate out of the substrate holder assembly, flips the substrate from a face-down position to a face-up position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module using deionized water or a combination of deionized water and a cleaning fluid as described in detail above. The substrate is then positioned for transfer out of the SRD module. The loading station transfer robot 228 picks up the substrate from the SRD module 236 and transfers the processed substrate into the RTA chamber 211 for an anneal treatment process to enhance the properties of the deposited materials. The annealed substrate is then transferred out of the RTA chamber 211 by the loading station robot 228 and placed back into the substrate cassette for removal from the electroplating system. The above-described sequence can be carried out for a plurality of substrates substantially simultaneously in the electroplating system platform 200. The electroplating system can be adapted to provide multi-stack substrate processing.

2. Substrate Holder

FIG. 25 is a partial cross sectional view of an alternative embodiment of the substrate holder 14 from the embodiment shown in FIG. 6. In the embodiment of substrate holder 14 shown in FIG. 25, the substrate held by the substrate holder can be spun about a vertical axis that extends through the substrate. The substrate holder 14 includes a rotatable head assembly 2410 and a head assembly frame 2452. The head assembly frame 2452 includes a mounting post 2454, a shaft 2453, a post cover 2455, a cantilever arm 2456, a cantilever arm actuator 2457, and a pivot joint 2459. The mounting post 2454 is mounted onto the body of the mainframe 214, and the post cover 2455 covers a top portion of the mounting post 2454. Preferably, the mounting post 2454 provides rotational movement, as indicated by arrow A1, with respect to a vertical axis along the mounting post to allow rotation of the head assembly frame 2452 about a substantially vertical axis. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on the mounting slide 2460 to provide vertical displacement of the head assembly 2410.

One end of the cantilever arm 2456 is connected to the shaft 2453 of the cantilever arm actuator 2457, such as a pneumatic cylinder, a lead-screw actuator, or a servo-motor. The cantilever arm actuator 2457 is mounted on the mounting post 2454. The pivot joint 2459 pivotably connects the cantilever arm 2458 and the post cover 2454. Actuation of the cantilever arm actuator 2457 provides pivotal movement, as indicated by arrow A2 of the cantilever arm 2456 about the pivot joint 2459. Retracting the cantilever arm actuator 2457 results in the cantilever arm 2456 moving the head assembly 2410 away from the process cell 420, shown in FIG. 6. Moving the head assembly from the process cell provides spacing to remove and/or replace the process cell 420 from the electroplating process cell 240. When the head assembly is removed from the process cell, the substrate can be inserted into or removed from the head assembly. Rotating the head assembly 2410 about the pivot joint 2459 results in the substrate being angled relative to the electrolyte cell. When the cantilever arm actuator 2457 is extended, the cantilever arm 2456 moves the head assembly 2410 toward the process cell 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that upon rotation displaces the lift guide, as indicated by arrows A3, between various vertical positions. The rotating actuator 2464 is connected to the substrate holder assembly 2450 through the shaft 2470 and rotates the substrate holder assembly 2450, as indicated by arrows A4.

The rotation of the substrate during the electroplating process generally enhances the deposition results. The head assembly is rotated between about 0 rpm and about 200 rpm (preferably about 10–40 RPM) during the electroplating process. If the substrate and the substrate holder are rotated at above the 200 RPM limit while the substrate and/or the substrate holder are immersed in the electrolyte solution, then a fluid turbulence is imparted into the electrolyte solution. The head assembly can also be rotated as the head assembly is lowered to position the substrate in contact with the electrolyte solution in the process cell as well as when the head assembly is raised to remove the substrate from the electrolyte solution in the process cell. The head assembly is preferably rotated at a high speed of up to about 2500 RPM preferably about 20 rpm to 2500 RPM after the head assembly is lifted from the process cell to enhance removal of residual electrolyte solution on the head assembly.

Figure 27:
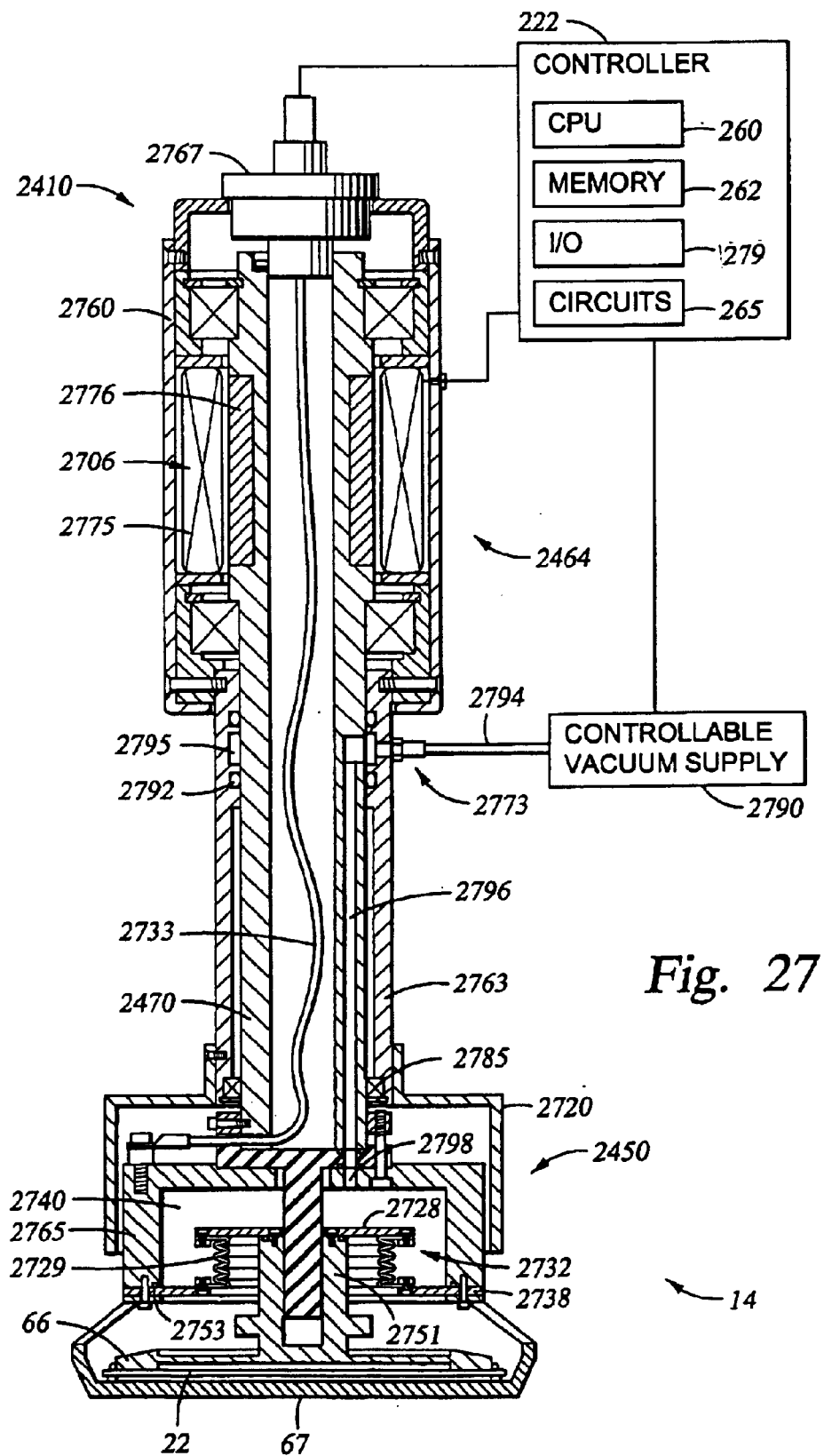
FIG. 27 is an enlarged cross sectional view of one embodiment of the substrate holder of FIG. 25.

FIG. 27 shows a cross sectional view of one embodiment of rotatable head assembly 2410 that can be contained in the substrate holder 14 of the embodiment shown in FIG. 25. The rotatable head assembly 2410 comprises a substrate holder assembly 2450, a rotating actuator 2464, a shaft shield 2763, a shaft 2470, an electric feed through 2767, an electric conductor 2771, and a pneumatic feed through 2773. The rotating actuator 2464 comprises a head rotation housing 2760 and a head rotation motor 2706. The head rotation motor 2706 comprises a hollow coil segment 2775 and a magnetic rotary element 2776. The hollow coil segment 2775 rotates the magnetic rotary element 2776 about a vertical axis in a manner known in the motor arts. The substrate holder assembly 2450 comprises a fluid shield 2720, a contact housing 2765, a rotary mount 2799, a thrust plate 66, an electric contact element 67, and a spring assembly 2732.

The contact housing 2765 and the spring assembly 2732 are generally annular, and these two elements interfit to provide for a combined rotation. The spring assembly 2732 comprises upper spring surface 2728, spring bellow connector 2729, and lower spring surface 2738. Seal element 2751 seals the fluid passage between the upper spring surface 2728 and the thrust plate 66. Seal element 2753 seals the fluid passage between the lower spring surface 2738 and the contact housing 2765.

Electricity is to be supplied to the electric contact element 67 that contacts the seed layer on a substrate to provide a desired voltage between the anode 16 and the seed layer on the substrate to effect the electroplating. Electricity is supplied from the controller 222 to the electric contact element 67 via the electric feed through 2767 and the contact housing 2765. The electric contact element 67 is in physical, and electrical, contact with the seed layer on the substrate. The shaft 2470, the contact housing 2765, the spring assembly 2732, the thrust plate 66, the electric contact element 67, the rotary mount 2799, and the substrate 22 (secured between the thrust plate 66 and the electric contact element 67) all rotate as a unit about a longitudinal axis of the head assembly 2410. The head rotation motor 2706 provides the motive force to rotate the above elements about its vertical axis.

A vacuum is controllably supplied to portions of the rotatable head assembly 2410 by the pneumatic feed through 2773 to control the position of the thrust plate relative to the electric contact element 67. The pneumatic feed through 2773 that supplies the vacuum comprises a controllable vacuum supply 2790, a sleeve member 2792, a fluid conduit 2794, a circumferential groove 2795, a fluid aperture 2796, and a fluid passage 2798. The sleeve member 2792 may be a distinct member, or a portion of the shaft as shown in FIG. 27. The circumferential groove 2795 extends within the sleeve member 2792 about the circumference of the shaft 2470. The pneumatic feed through supplies a vacuum to a pressure reservoir 2740. The pressure reservoir is configured to maintain either positive air pressure or vacuum, depending upon the configuration of the head assembly 2410. The fluid aperture 2796 is in fluid communication with the circumferential groove. The fluid aperture 2796 extends axially through the shaft 2470 from the circumferential groove 2795 to the bottom of the shaft 2470. The fluid passage 2798 extends through the contact housing 2765. The fluid aperture 2796 at the bottom of the shaft is in fluid communication with the fluid passage 2798. The inner surface of the sleeve member 2792 has a small clearance, e.g. about 0.0002 inch, with the outer surface of the shaft 2470 to allow relative rotation between these two members.

A vacuum is applied from the vacuum supply 2790 via the fluid conduit 2794 to the inner surface of the sleeve member 2792 and the circumferential groove 2795. The vacuum is applied from the fluid aperture 2796 to the fluid passsage 2798, and the pressure reservoir 2740. Due to the tight clearance between the sleeve member 2792 and the shaft 2470, a vacuum applied to the inner surface of the sleeve member 2792 passes via the circumferential groove 2795 to the fluid aperture 2796. The tight clearance limits air entering between the sleeve member 2792 and the outer surface of the shaft 2470. Therefore, the vacuum applied from the controllable vacuum supply 2790 extends to the pressure reservoir. A vacuum within the shaft 2470 passes through the fluid passage 2798 to a pressure reservoir 2740 formed between the spring assembly 2732 and the contact housing 2765. The vacuum applied by the controllable vacuum supply 2790 thereby controls the vacuum in the pressure reservoir 2740.

The spring bellow connector 2729 combines aspects of a spring and a bellows. The spring bias connector 2729 is attached between the thrust plate 66 and the contact housing 2765. The spring bellows connector 2729 limits fluid flow between the thrust plate 66 and the electric contact element 67. The spring bellows connector 2729 exerts a spring factor when axially displaced, either compressed or extended, from its relaxed shape. The bias of the spring bellow connector 2729 is used to position the thrust plate 66 relative to the electric contact element 67. Any suitable type of biasing member that has a spring constant may be applied as spring bellow connector 2729. Alternatively, separate spring and bellows members may be used as the spring bellow connector 2729. The upper spring surface 2728 is annular shaped and is sealably connected to the thrust plate 66. The lower spring surface 2738 is rigidly, sealably connected to the contact housing 2765. A pressure reservoir 2740 is defined in the annulus between the contact housing 2765 and the spring assembly 2732. In one embodiment, the thrust plate is normally firmly pressed against the backside of the substrate by the spring tension exerted by the spring bellow connector 2729. Application of the vacuum within the pressure chamber 2740 raises spring bellows connector 2729, and thereby also raises the thrust plate 66.

The thrust plate 66 is displaced to a raised position when a robot, not shown, is loading or unloading a substrate 48 onto the electric contact element 67. Following insertion by the robot, the substrate 48 rests upon the electric contact element 67 such that the periphery of the plating surface of the substrate 48 contacts the electric contact elements. The thrust plate 66 is then lowered firmly against the upper surface of the substrate 48 to ensure a snug contact between the plating surface of the substrate 48 and the electric contact element 67. The controller 22 selects the electricity can be applied from the controller 222 to the seed layer on the substrate 22.

The substrate holder assembly 2450 is configured to hold a substrate 22 in a secured position such that the substrate can be moved between the exchange, dry, and process positions. The thrust plate 66 can also be biased downwardly to secure a substrate 22 against the electric contact element 67. The thrust plate 66 can be biased upward to provide a space between the thrust plate 66 and the electric contact element 67 through which a substrate can be inserted by a robot device. In the embodiment shown in FIG. 27, upward bias to the thrust plate is provided by a vacuum created within pressure reservoir 2740 by the controllable vacuum supply 2790. The vacuum in the pressure reservoir 2740 causes the upper spring surface 2728, the remainder of the spring assembly 2732, and the attached thrust plate 66 to be displaced upwardly.

Reducing the vacuum from the controllable vacuum supply 2790 allows the spring bellow connector 2729 to return to its normal tensioned position by which the upper spring surface 2728 biases the attached thrust plate 66 into secure contact with a substrate 22 positioned on the electric contact element 67. This physical biasing of the substrate against the electric contact element 67 is sufficient to enhance the electric contact between the electric contact element 67 and the seed layer on the substrate 22. The electric contact element 67 extends about the periphery of the seed layer on a substrate inserted in the substrate holder assembly, and is electrically biased relative to the anode assembly 474 shown in the embodiment of FIG. 6 to effect metal deposition on the seed layer. The thrust plate 66, the electric contact element 67, the spring bellow connector 2729, and a substrate inserted on the electric contact element all rotate relative to the fluid shield 2720. The fluid shield 2720 remains fixed to the shaft shield 2763 and does not rotate.

The head rotation motor 2706 is mounted within, and at least partially extends through, the inner circumference of the hollow head rotation housing 2760 and is connected to the shaft 2470. The hollow coil segment 2775 is mounted to, and remains substantially stationary relative to, the inside of the hollow head rotation housing 2760. The shaft 2470 includes a magnet portion 2777 that can be rotated about a vertical axis. The magnet portion 2777 is physically disposed within the hollow portion of the hollow coil segment 2775. The hollow coil segment 2775 induces rotation in the magnet portion 2777 also the remainder of the shaft 2470. Bearings 2785 are provided between shaft shield 2763 and the shaft 2470 to limit lateral travel of the shaft 2470 during rotation about a vertical axis. The output of the shaft 2470, at the lower end of the shaft, provides rotary motion to certain portions of the substrate holder assembly 2450 including a thrust plate 66 and a substrate 22 held between to the thrust plate and the electric contact element 67, as described below. The head rotation motor 2706 may be of the type that produces output rotation in the range from, for example, 0 RPM to 2500 RPM under the influence of the controller 222.

The fluid shield 2720 is optional, and when used it may be disposed about the periphery of, and preferably spaced from, the substrate holder apparatus 2450. The fluid shield contains electrolyte solution or other matter that may be spun by centrifugal rotation of the substrate holder apparatus 2450.

3. Operation of the Substrate Holder

The substrate holder assembly 2450 operates as follows. The substrate holder assembly 2450 moves into the exchange position when a robot is inserting or retracting a substrate 22 into the substrate holder assembly 2450. A vacuum within the pressure reservoir 2740 is initially increased, or a pressure is decreased, to allow the substrate holder assembly to be displaced into the exchange position by lifting the thrust plate. This increased vacuum in the pressure reservoir 2740 permits the spring assembly 2732 to bias the sealing plunger 328, in addition to the plunger rod 330, and the thrust plate 66, upwardly in a direction indicated by arrow 336. When the thrust plate is displaced upwardly such that the substrate holder assembly 2450 is in the exchange position, a robot can insert a substrate 22 between the thrust plate 66 and the electric contact element 67. The robot is then retracted while leaving the substrate on the electric contact element.

The thrust plate 66 is then lowered to contact, and exert a slight physical force against, the backside of the substrate. To accomplish this, the vacuum in the pressure reservoir 2740 is reduced, or a pressure is increased, to a level to overcome the bias applied by the spring assembly 2732. This reduced vacuum biases the thrust plate 66 downwardly. The thrust plate contacts the substrate that is resting on the electric contact element 67 with sufficient pressure to force the substrate into electric contact with the electric contact element 67. Due to the concentricity of the area within the substrate holder device 14 that the vacuum is applied, and the shape of the substrate, the vacuum applied within pressure reservoir 2740 is substantially evenly distributed around the upper surface of the upper spring surface 2728. The upper spring surface 2728 is connected to the thrust plate 66. Pressure evenly applied to the upper spring surface 2728 is therefore converted to an evenly applied downward force on the thrust plate 66 to the backside of the substrate. The even force applied from a lip seal 398 on the substrate will form a bias around the periphery of the substrate. This bias around the substrate periphery results in a uniform electric contact from the electric contact element 67 to the seed layer on the substrate.

When the thrust plate 66 is lowered into electric contact element with a substrate 22, the thrust plate, the substrate 22, the electric contact element 67, and the sealing plunger 328 can all rotate as a unit wherein rotation is imparted to the substrate 22. The above rotation may be desired to deposit a more consistent metal film across a plating surface of the substrate during plating operation. Alternatively, the processing can be performed on stationary substrate 22, wherein the thrust plate 66, the substrate 22, the electric contact element 67, the sealing plunger 328, and the spring assembly 2732 remain stationary. The electric contact element 67 is often configured with raised portions, not shown, that are configured to contact the seed layer to enhance the electric contact with the seed layer.

In the process position, the substrate holder assembly 2450 supports the substrate 22 in a position where the plating surface is immersed in the electroplating solution contained in the electrolyte cell, as shown in FIG. 2. When the substrate holder assembly 2450 is lowered into the process position, portions of the head portion 2450 including the one-piece structure 326, the thrust plate 66, in those embodiments in which the substrate is rotated, and the electric contact element 67 are rotated at an angular velocity of between about 0 and about 200 RPM, preferably from about 10 to about 40 RPM. The rotation of the substrate 22 that is secured between the thrust plate and the electric contact element enhances the uniformity of the deposition of the metal film across the plating surface. The angular velocity of the substrate 22 and the rotating portions of the substrate holder assembly 2450 is at a level that does not create too much turbulence in the electroplating solution as would be created by excessive angular velocities. The metal ions produced by the reaction between the electroplating solution and the anode 16, is deposited on the plating surface on the substrate 22 when the substrate holder 14 is in the process position. Alternatively in those substrate holder assembly embodiments that do not rotate such as those associated with the fountain plater 10 in FIG. 1, the portions of the substrate holder assembly 2450 including the one-piece structure 326, the thrust plate 66, and the electric contact element 67 are not rotated.

After the processing is completed on the substrate 22, the substrate holder assembly 2450 is displaced to remove the entire substrate 22 from the electroplating solution. To provide for the displacement between the process position and the dry position, the lift guide 2466 is translationally displaced upwardly relative to the mounting slide 2460. When the substrate holder assembly 2450 is in the dry position following the removal of the substrate 22 from the electroplating solution, the head rotation motor 306 in the head rotation portion 304 rotate the substrate holder assembly at between about 600 and about 8000 RPM, preferably about 2000 RPM, in those embodiments in which the substrate holder assembly rotate. This angular rotation of the substrate 22 effects drying of the substrate 22 by spinning the liquid off the substrate using inertia. Alternatively, the substrate 22 can be transported to a separate spin-rinse-dry unit, not shown.

It is to be emphasized that while the above provides a detailed description of several embodiments of substrate holders, any substrate holder can be used that is capable of inserting a substrate into electrolyte solution contained within a process cell 420. For example, the substrate holder may be capable of rotating a substrate about a vertical axis, or not capable of such a rotation.

4. Deposition Uniformity Considerations

Figure 28:
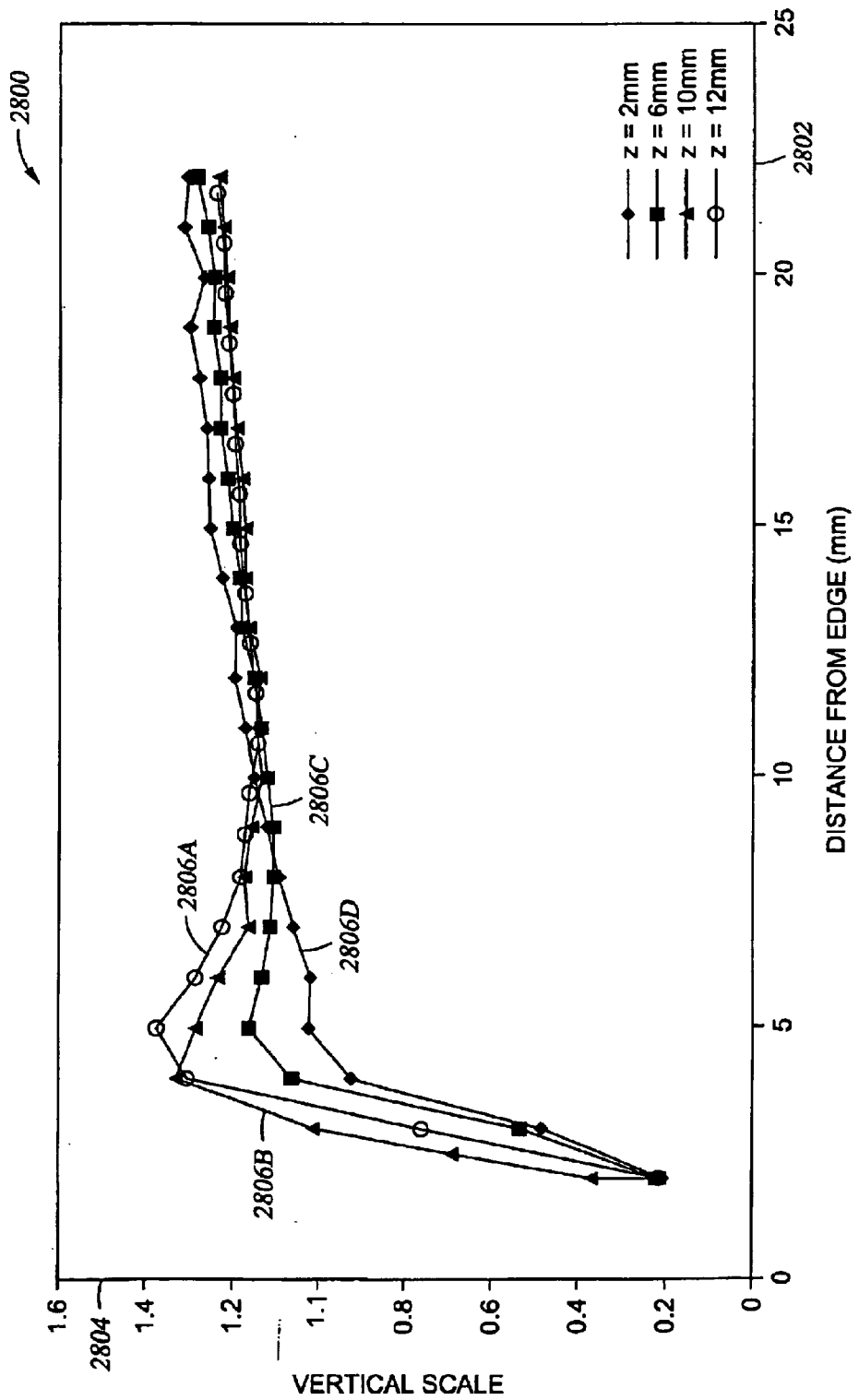
FIG. 28 is one embodiment of a graph plotting distance from the edge of a substrate as the abscissa versus copper thickness in micrometers for a substrate after electrochemical deposition located at a variety of heights above the anode.

FIG. 28 shows a graph 2800 of a plurality of curves 2806a, 2806b, 2806c, and 2806d, each curve depicts the uniformity of the thickness of the deposited metal film across the radius, from the center to the periphery of the substrate. In this disclosure, the term "radius" is used as applied to a substantially circular substrate such as a substrate. The substrates may be substantially rectangular, oblong, etc. As such, the term "radius" as applied to substrates relates to a line extending from the center of the substrate to the edge of the substrate. Such a curve of the uniformity of the thickness of the metal film deposited from the center to the periphery of the seed layer is also known as a profile. The electrolyte cell 212 includes a cylindrical portion having substantially the same diameter as the substrate and an overflow portion at the opening of the electrolyte cell 212. A height Z, see FIG. 6, is the vertical position of the substrate relative to the electrolyte cell. The height Z may be taken relative to different electrolyte cell locations. However, in this disclosure, the height Z is considered the distance from the plating surface of the substrate to an upper edge of the plating cell shown in FIG. 6. In FIG. 28, the abscissa 2802 represents the distance of a substrate seed layer point from the edge of the substrate in millimeters. The ordinate 2804 represents the thickness of the deposited copper in microns. The deposited metal film thickness across the radius of the seed layer on the substrate is displayed for a plurality of curves 2806a, 2806b, 2806c, and 2806d. Each curve 2806a, 2806b, 2806c, and 2806d varies from the others only as a function of the height Z. Curve 2806a represents a height Z of 12 millimeters. Curve 2806b represents a height Z of 10 millimeters. Curve 2806c represents a height Z of 6 millimeters. Curve 2806d represents a height Z of 2 millimeters. FIG. 28 shows that modifying the height Z can affect the uniformity in deposition thickness of metal film across the seed layer on the substrate. A similar relationship for a variety of consistencies of the plating thickness across the seed layer as a function of the height Z has been demonstrated under a wide variety of plating conditions. Typical values for current densities in the seed layer during plating include 5 to 60 mA/cm$^2$. Plating time for deposition of the 1.2 micron thick layer depend on the specific recipe and plating currents, but typically range from about 30 seconds to about 3 minutes. The voltage drop from the anode to the seed layer on the seed layer is on the order of 40 volts, and this value varies depends on cell impedance and the desired current.

FIG. 28 is an exemplary illustration of the effect that varying the height Z has on plating thickness uniformity across the radius, from the center to the periphery. Of the above curves, 2806c is more consistent, more uniformity, in deposition thickness than curve 2806a, for example. The height Z of the substrate 22 is varied by the vertical motion of the lift guide 2466 relative to the mounting slide 2460 as shown in FIG. 25. This vertical motion of the lift guide 2466 relative to the mounting slide 2460 is controlled by the controller 222 by controlling the operation of the head lift actuator 2458. To provide a more consistent deposition depth from the center of the substrate to the edge of the substrate, the height Z is selected to provide the greatest uniformity in deposition thickness across the radius of the substrate.

There are several techniques to determine deposition thickness on the seed layer on the substrate. These techniques typically involve physical measurement of the thickness of the deposited layer on the substrate following the deposition. This physical measurement of the deposited layer can be accomplished using destructive and non-destructive microscopic measurement of a substrate, chemical analysis techniques such as electric four point probe measurement, X-ray based thickness measurements, and laser based measurements of sound wave behavior as a function of thickness. For example a METAPULSE® tool produced by Rudolph Research Corporation of Flanders, N.J. is one type of laser based measurement tool that may be used.

During operation, multiple substrates are plated under different conditions, a change in the height Z, different bowing of the substrates, etc. The uniformity of the deposition thickness from the center to the edge of the substrate is then measured using the above techniques for each one of the plurality of substrates.

The Z position of the substrate holder relative to the electrolyte cell, shown in the embodiment of FIG. 6, can be calibrated. This calibration assumes that the mounting slide 2460 is upright, the pivot joint 2459 is not angled in the embodiment of FIG. 25, relative to the head assembly frame 2452 about the pivot joint 2459. If the pivot joint 2459 is angled, the Z position has to be recalibrated for each angle of the pivot joint. The controller 222 can have constant input of the Z position. For instance, assume a certain position of the substrate within the electrolyte cell is calibrated within the controller 222 as the "Z=2 mm" position when the pivot joint 2459 is not angled. To displace the substrate 22 to the Z=6 mm position, that is 4 mm above the prior position, the lift guide is vertically raised 4 mm. To accomplish this, the controller actuates the head lift actuator 2458 to displace the lift guide 2466 to the position that is calibrated as the "+4 mm" position along the mounting slide 2460.

The deposition rate of the metal film on each point on the seed layer on the substrate is a function of the electric current density for that point. An accurate measurement of the electric current density across the radius of the seed layer provides an indication of the deposition rate that will occur on the seed layer at the radius. If the electric current density across the seed layer is uniform from the periphery of the substrate to the center of the substrate, then it can be assumed that the deposition rate across the plating surface is also uniform since deposition rate is a function of current density. The electric current density applied across the radius of the substrate will therefore vary based on the height of the seed layer on the substrate within the electrolyte cell. The Z position therefore has a relation to the consistency, or uniformity, of the current density across the substrate. The current density varies across the seed layer, from the periphery to the center of the substrate, for several reasons. First, the electric contact element 67 is located closer to the periphery of the substrate than the center. Since the material of the seed layer has an inherent resistance, the electric current density of those locations near the electric contact element will be higher than those locations remote from the electric contact element. This generally results in higher electric current density near the periphery of the substrate compared to the center of the substrate.

Another reason for variations in the electric current density applied across the seed layer on the substrate relates to the vertical distance between the anode and the particular seed layer location. Current flows from the anode through the electroplating solution contained in the electrolyte cell 212 to the seed layer on the substrate. The electroplating solution contained in the electrolyte cell 212 also has an inherent resistance. Electric current flowing from the anode to the cathode will seek the most direct path therebetween to limit the resistance. In most instances, as shown in the embodiment in FIG. 2, the shortest path between the anode and the seed layer is the distance substantially perpendicular to both. For example, most of the electric current from the anode to the seed layer would flow generally perpendicular to the anode surface 16 upwardly, to the nearest seed layer location, and contact the bottom of the seed layer perpendicularly. The anode in many cases does not have a horizontal diameter that corresponds to the diameter of the seed layer on the substrate. For example, if the anode 16 is larger than the substrate 22 then current densities will therefore vary across the seed layer from the center to the periphery of the substrate. Certain portions of the seed layer on the substrate may also be exposed to a slightly higher current flowing from the anode 16 due to inconsistencies on the seed layer geometry compared to the anode geometry.

Additionally, if the substrate holder 14 positions the substrate 22 closer or further away from the anode 16, then the overall resistance of the electroplating solution between the anode 16 to the seed layer is altered. As the height Z of the substrate within the electrolyte cell increases, so does the resistance of the electroplating solution between the anode 16 and the seed layer. As the resistance of the electroplating solution increases, the total current flowing from the anode to the seed layer diminishes and could cause differences in deposited thickness on successive substrates. Irregularities in the homogeneity of the resistances of the electrolyte solution also affect the electric current density at different locations across the substrate. The height Z affects the homogeneity of the resistances of the electrolyte solution.

Each of the above reasons explain why the electric current density variations across the substrate contribute to variations of the metal film deposition rate, and non-uniformities in the deposition rate of the metal film, applied to the seed layer on that substrate along the radius of the seed layer. So many complex factors are involved in the current density of a seed layer that it is difficult to precisely predict the current densities across the seed layer from the periphery to the center of the substrate. Similarly, many complex factors are involved in the metal film deposition rate so it is often difficult to predict the deposition rate. It is often more useful, and usually more accurate, to measure either the current densities or the thickness of the deposited layer across the seed layer. An accurate measurement of the electric current density across the radius of the substrate is simpler in the fountain plater embodiment shown in FIG. 1, in which the substrate does not rotate during operation, than in the electroplating process cell 400 shown in FIG. 6. In those embodiments that the substrate rotates during processing, a sensor of electric current density has to "rotate" with the substrate. The above provides a description of controlling deposition depth and rate uniformity across a radius of a substrate as a function of the height Z of the substrate within the electrolyte cell. It is envisioned that uniformity in the deposition rate across a radius of a substrate can be controlled by repositioning the substrate within the electrolyte cell in a variety of directions. For example, moving the substrate laterally within an electrolyte cell can enhance the uniformity of the electric current density applied across the radius of the substrate. The electrolyte cell can be configured in various horizontal-cross sectional shapes enhance the uniformity of the deposition rate. It is envisioned that the rotatable head assembly 2410 can position a plurality of substrates within the electrolyte cell at a variety of locations. The uniformity of the deposition rates across the radius of the substrate can be determined for substrates exposed to different test locations, different heights or lateral locations within the electrolyte cell. Actual curves of the uniformity of the deposition rate for a plurality of different positions across the radius of the tested substrates can be stored in the controller 222 for a variety of variables. These variables may include, but are not limited to, processing time, electric current/voltage between the anode and the seed layer on the substrate, chemical mixture of the electrolyte solution, etc. During production plating, the rotatable head assembly can position the substrates in the desired location that provide the most suitable deposition characteristics across the seed layer on the substrate. For example, it may be desired to coat heavier towards the center than the periphery, to coat heavier towards the edge than the periphery, or coat uniformly across the seed layer from the center to the periphery. To provide the desired deposition, the substrates are held at the position within the electrolyte cell that provided that profiles of deposited metal film on the substrate closest to that desired, and the substrate undergoes similar processing.

Another embodiment of "positioning" the substrate within the electrolyte cell to alter the uniformity of the deposition depth along the radius of the seed layer involves varying the vertical cross-sectional shape of the substrate itself. For example, the substrate 22 may be "bowed" in a direction so the center of the substrate is not on the same plane as the periphery of the substrate, the substrate is curved. Such bowing of the substrate may be provided by the operation of the rotatable head assembly 2410 shown in the embodiment of FIG. 27. Any other device that positions or deforms the substrate to position different portions of the substrate at different distance from the anode is within the scope of the invention. Assume that the thrust plate 66 contacts the upper surface, or includes a biasing device such as baffles that contact the upper surface. Also assume that the locations on the substrate that the thrust plate contacts the substrate has a smaller radius than the radius at which the electric contact elements 67 contact the periphery of the bottom surface of the substrate. F1 indicates the upward forces applied to the lower surface of the substrate by the electric contact elements 67. F2 indicates the two downward forces applied by the thrust plate 66 on the upper surface of the substrate. The magnitude of force F1 equals the magnitude of force F2 during normal operation since these are the only vertical forces acting on the substrate, and the substrate is not being vertically displaced. Since F1 is applied outside of, a greater distance apart than, F2, the substrate 22, that is assumed to by homogenous, bows as indicated.

Assuming that the rotatable head assembly 2410 holds the substrate in a level orientation, not considering the curvature of the bow, then the center 2902 of the substrate 22 is lower than the periphery 2904 of the substrate. Provided that the anode is below the substrate as shown in the embodiment of electroplating process cell 400 shown in FIG. 6, then the center 2902 is closer to the anode than the periphery 2904. As such, since less resistance is provided through the electrolyte solution from the anode to the center 2902 than the periphery 2904, then the deposition rate at the center should exceed the deposition rate at the periphery. Such bowing can be utilized to increase the deposition rate at the center of a substrate relative to the deposition rate near the periphery of the substrate. In instances where the metal film is being deposited on the seed layer near the periphery at a higher level near the periphery than the center, such bowing can result in a more uniform deposition across the seed layer on the substrate.

While foregoing is directed to preferred embodiments of the present invention, other and further embodiments of the invention may be devised without departing from the basic scope thereof, and the scope thereof is determined by the claims that follow.

What is claimed is:

1. An apparatus for electro-chemically depositing a metal film on a seed layer disposed on a substrate, comprising:
    a substrate holder configured to hold a substrate;
    an electrolyte cell configured to receive the substrate in a processing position;
    an actuator connected to the substrate holder, the actuator being configured to adjustably position the substrate relative to the electrolyte cell; and
    a sensor configured to sense an electric current density across the seed layer.

2. An apparatus for electro-chemically depositing a metal film on a seed layer disposed on a substrate, comprising:
    a substrate holder configured to hold a substrate;
    an electrolyte cell having a body portion and an overflow portion, the overflow portion defining an opening for receiving the substrate in a processing position; and
    an actuator connected to the substrate holder, the actuator being configured to adjustably position the substrate relative to the body portion of the electrolyte cell.

3. The apparatus of claim 2, wherein the actuator is configured to position the substrate in a lateral direction relative to the electrolyte cell.

4. The apparatus of claim 2, wherein the actuator is configured to bow the substrate so that the center of the substrate is closer to an anode disposed in the electrolyte cell than the periphery of the substrate.

5. The apparatus of claim 2, wherein the actuator is configured to vary a vertical distance between the substrate and the body portion.

6. The apparatus of claim 2, wherein the actuator is configured to adjust a vertical distance between the substrate and the body portion of the electrolyte cell.

7. The apparatus of claimed 2, wherein a diameter of the body portion is substantially the same as a diameter of the substrate.

8. An apparatus for electro-chemically depositing a metal film on a seed layer disposed on a substrate, comprising:
    a substrate holder configured to hold a substrate;
    an electrolyte cell configured to receive the substrate in a processing position;
    an actuator connected to the substrate holder, the actuator being configured to bow the substrate relative to the electrolyte cell.

9. A method of controlling uniformity in a deposition depth of a metal film from the center of a seed layer on a substrate to the periphery of the seed layer, the method comprising:
    inserting a substrate having a seed layer into an electrolyte cell; and
    bowing the substrate relative to the electrolyte cell.

10. The method of claim 9, wherein sensing the uniformity of an electric current density is performed after the substrate has been removed from the electrolyte cell.

11. The method of claim 9, wherein bowing the substrate comprises:
    applying a downward force to the substrate at a position between the center of the substrate and the periphery of the substrate; and
    applying an upward force to the substrate at the periphery of the substrate.

12. A method for controlling uniformity of a deposition depth of a metal film from the center of a seed layer on a substrate to the periphery of the seed layer, the method comprising:
    inserting a substrate having a seed layer into an electrolyte cell; and
    adjusting the horizontal position of the substrate within the electrolyte cell.

13. A method for electro-chemically depositing a metal film on a substrate having a metal seed layer, the method comprising:
    disposing a substrate in an electrolyte cell having a body portion and an overflow portion, the overflow portion defining an opening for receiving the substrate in a processing position; and adjustably positioning the substrate relative to the body portion of the electrolyte cell.

14. The method of claim 13, wherein adjustably positioning comprises adjusting the vertical height of the substrate.

15. A method for controlling uniformity of deposition rate of a metal film on a substrate, the method comprising:

disposing a substrate in an electrolyte cell; and adjusting the lateral position of the substrate relative to the electrolyte cell to control the deposition rate.

16. A method for controlling uniformity of deposition rate of a metal film on a substrate, the method comprising:

disposing a substrate in an electrolyte cell;

adjusting the curvature of the substrate relative to the electrolyte cell; and determining the uniformity of the deposition layer by measuring the thickness of the metal film.

17. An apparatus for electro-chemically depositing a metal film on a substrate having a metal seed layer, comprising:

a substrate holder for holding the substrate;

an electrolyte cell having a body portion and an overflow portion, the overflow portion defining an opening for receiving the substrate in a processing position, and a metal deposition portion that provides for deposition of the metal film on the metal seed layer; and an actuator connected to the substrate holder for displacing the substrate holder in a substantially vertical direction to adjust the position of the substrate relative to the body portion of the electrolyte cell.

18. A method for electro-chemically depositing a metal film on a seed layer disposed on a substrate, comprising:

disposing a substrate in an electrolyte cell having a body portion and an overflow portion, the substrate being disposed above an upper edge of the body portion;

varying a distance between the substrate and the upper edge of the body portion; and contacting a seed layer disposed on the substrate with an electrolyte solution.

19. The method of claim 18, wherein varying the distance comprises varying a vertical distance between the substrate and the upper edge of the body portion.

20. An apparatus for electro-chemically depositing a metal film on a seed layer disposed on a substrate, comprising:

an electrolyte cell configured to receive a substrate in a processing position; and a substrate holder having a thrust plate and a plurality of contact elements, the substrate holder being configured to hold the substrate between the thrust plate and the contact elements and to vary a cross-sectional shape of the substrate.

21. The apparatus of claim 20, wherein the thrust plate is configured to apply a downward force.

22. The apparatus of claim 20, wherein the contact elements are configured to apply an upward force.

23. The apparatus of claim 20, wherein the thrust plate is configured to apply a downward force and the contact elements are configured to apply an upward force.

24. The apparatus of claim 20, wherein the thrust plate has a diameter smaller than a diameter defined by the plurality of the contact elements.

25. The apparatus of claim 20, wherein the cross-sectional shape of the substrate is such that a center of the substrate is lower than a periphery of the substrate.

26. The apparatus of claim 25, wherein the electrolyte cell comprises an anode disposed therein, and wherein the cross-sectional shape of the substrate is such that the center of the substrate is closer to the anode than the periphery of the substrate during processing.

27. A method for controlling uniformity of deposition rate of a metal film on a substrate, the method comprising:

disposing a substrate in an electrolyte cell; and adjusting the curvature of the substrate relative to the electrolyte cell by applying a downward force at the center of the substrate and applying an upward force at the periphery of the substrate.

28. The method of claim 27, wherein adjusting the curvature of the substrate comprises bowing the substrate.

29. The method of claim 27, wherein adjusting the curvature of the substrate comprises adjusting the center of the substrate and periphery of the substrate so that the center of the substrate is not on a same plane as the periphery of the substrate.

30. An apparatus for electro-chemically depositing a metal film on a seed layer disposed on a substrate, comprising:

a substrate holder configured to hold a substrate;

an electrolyte cell configured to receive the substrate in the processing position and adapted to have an inner diameter substantially the same as a diameter of the substrate;

a contact ring coupled to the substrate holder configured to dispose the substrate on the contact ring in a processing position, the contact ring and the electrolyte cell defining a gap therebetween; and an actuator coupled to the substrate holder, the actuator being configured to vary a distance defined by the gap.

* * * * *